(12) United States Patent
Ujiie et al.

(10) Patent No.: US 6,853,089 B2
(45) Date of Patent: Feb. 8, 2005

(54) SEMICONDUCTOR DEVICE AND METHOD OF MANUFACTURING THE SAME

(75) Inventors: Mikako Ujiie, Kokubunji (JP);
Michiaki Sugiyama, Tokyo (JP);
Kazunari Suzuki, Tokyo (JP);
Masachika Masuda, Tokorozawa (JP);
Tamaki Wada, Higashimurayama (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 189 days.

(21) Appl. No.: 10/225,163

(22) Filed: Aug. 22, 2002

(65) Prior Publication Data

US 2003/0052419 A1 Mar. 20, 2003

(30) Foreign Application Priority Data

Sep. 18, 2001 (JP) ........................................ 2001-283717

(51) Int. Cl.[7] .......................... H01L 23/48; H01L 23/28; H01L 21/44
(52) U.S. Cl. ........................ 257/783; 257/782; 257/784; 257/787; 438/112; 438/124
(58) Field of Search ................................ 257/782, 783, 257/784, 787; 438/112, 124

(56) References Cited

U.S. PATENT DOCUMENTS

| | | | |
|---|---|---|---|
| 5,336,931 A | * | 8/1994 | Juskey et al. ................ 257/787 |
| 6,200,121 B1 | | 3/2001 | Tsuruta ........................ 425/127 |
| 6,448,507 B1 | * | 9/2002 | Fontecha et al. ............ 174/260 |
| 2001/0026959 A1 | * | 10/2001 | Jimarez et al. .............. 438/126 |
| 2002/0084518 A1 | * | 7/2002 | Hasebe et al. .............. 257/676 |
| 2002/0125557 A1 | * | 9/2002 | Chen et al. .................. 257/686 |
| 2002/0149102 A1 | * | 10/2002 | Hashemi et al. ............ 257/706 |
| 2002/0168798 A1 | * | 11/2002 | Glenn et al. ................. 438/110 |
| 2003/0042621 A1 | * | 3/2003 | Chen et al. .................. 257/784 |

FOREIGN PATENT DOCUMENTS

| | | |
|---|---|---|
| JP | 7-45641 | 2/1995 |
| JP | 8-167678 | 6/1996 |
| JP | 8-181166 | 7/1996 |
| JP | 2000-12578 | 1/2000 |
| JP | 2000-286271 | 10/2000 |

* cited by examiner

*Primary Examiner*—David E. Graybill
*Assistant Examiner*—James M. Mitchell
(74) *Attorney, Agent, or Firm*—Miles & Stockbridge P.C

(57) ABSTRACT

In the manufacture of a semiconductor device by adopting a block molding method wherein a semiconductor chip is fixed onto a wiring substrate through an adhesive, the occurrence of a defect caused by flowing-out of the adhesive is to be prevented. The semiconductor device according to the present invention comprises a wiring substrate, the wiring substrate having a main surface, an insulating film formed on the main surface, and electrodes formed on the main surface so as to be exposed from the insulating film, a semiconductor chip fixed through an adhesive onto the insulating film formed on the main surface of the wiring substrate, conductive wires for connecting the electrodes on the main surface of the wiring substrate and electrodes on the semiconductor chip with each other, and a seal member, i.e., a package, which covers the semiconductor chip, the main surface of the wiring substrate and the electrodes, wherein a groove is formed between the semiconductor chip and the electrodes and the seal member and the wiring substrate have side faces cut by dicing. A protruding portion of the adhesive (an insulating resin) stays within the groove without getting over the groove and does not reach the electrodes. The groove is formed by removing the insulating film partially in the full depth direction of the film so as to extend through the film.

29 Claims, 27 Drawing Sheets

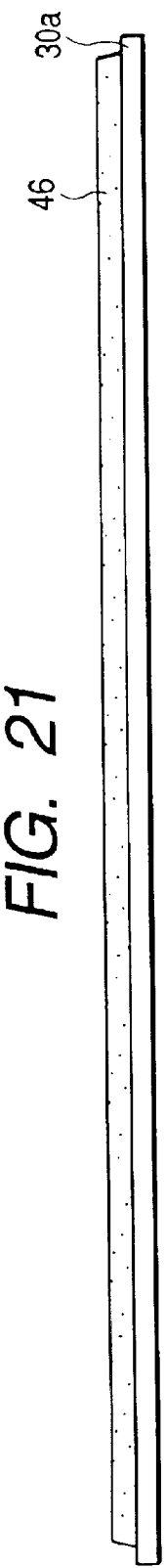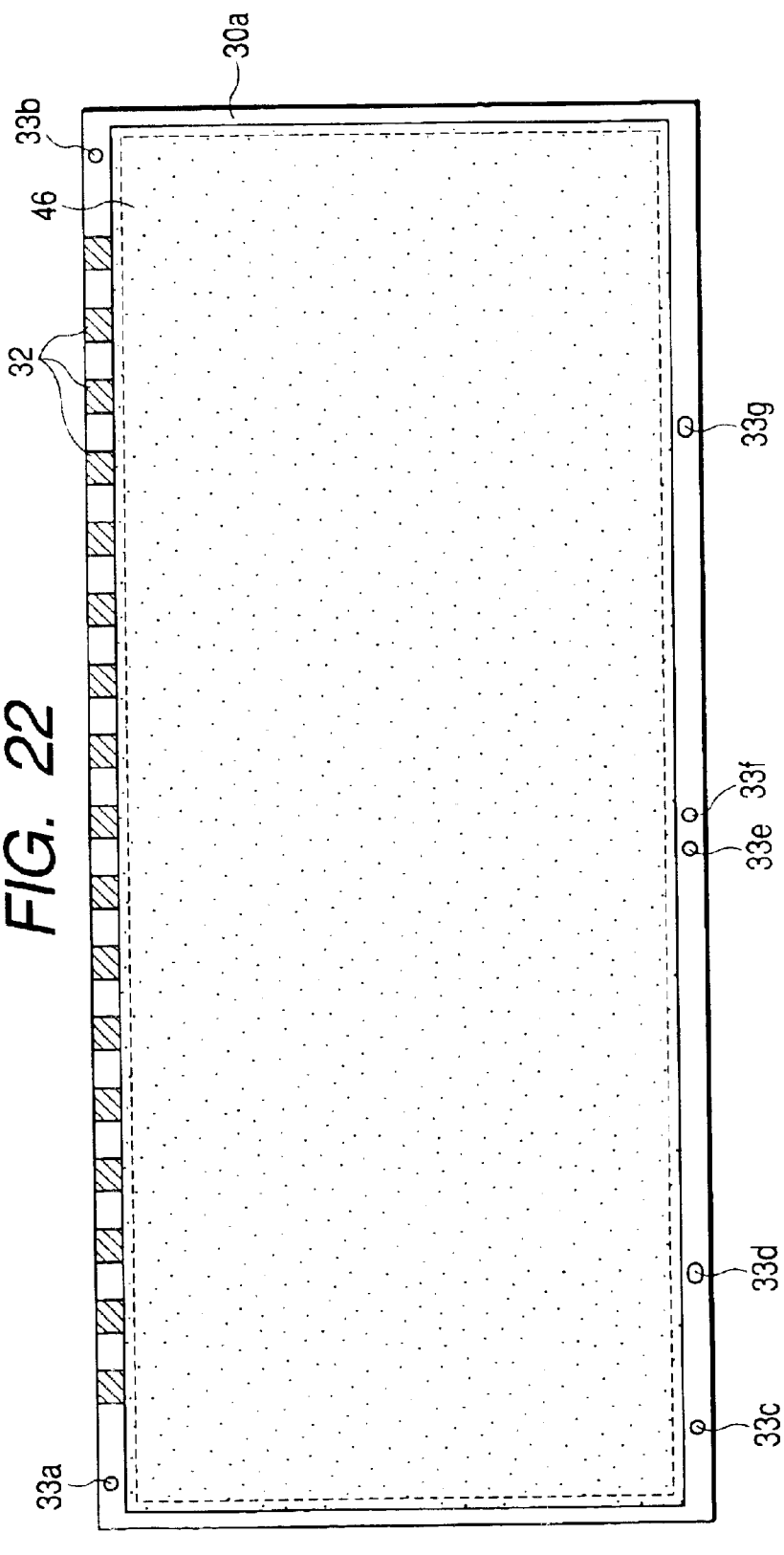

SEMICONDUCTOR DEVICE AND METHOD OF MANUFACTURING THE SAME

BACKGROUND OF THE INVENTION

The present invention relates to a semiconductor device and a method of manufacturing the same. Particularly, the present invention is concerned with a technique effectively applicable to a method (MAP: Matrix Array Packaging method) which involves block-molding a main surface side of a wiring board (substrate) with an insulating resin to cover the main surface side with a seal member, or a package, and thereafter dividing the mutually superimposed substrate and seal member longitudinally and transversely to afford plural semiconductor devices.

In semiconductor devices incorporated into small-sized electronic devices such as portable telephones, portable information processing terminal devices, and portable personal computers, it is required to reduce the thickness and size and attain a multi-pin structure. As package forms of semiconductor devices adapted for such a multi-function and high density configuration there are known such package structures as BGA (Ball Grid Array) and CSP (Chip Size Package).

As a method for fabricating such BGA or CSP there is known a method comprising providing a wiring substrate, then mounting a semiconductor chip (semiconductor element) at a predetermined position on a main surface of the wiring substrate, connecting electrodes on the semiconductor chip and wiring lines on the main surface of the wiring substrate with each other through conductive wires, then covering the main surface side of the wiring substrate with a sealing resin, and forming salient electrodes (bump electrodes) on a back surface of the wiring substrate which electrodes are connected to wiring lines.

In connection with a semiconductor device manufacturing method having a step of fixing a semiconductor chip onto a wiring substrate with use of an adhesive, there has been posed a problem that the adhesive flows out and contaminates electrodes formed on the wiring substrate, making an electrical connection with the electrodes difficult.

FIGS. 34 and 35 each illustrate a relation between a wiring board (substrate) 1 and a semiconductor chip 3 fixed onto the wiring substrate through an adhesive 2, in a conventional structure (a first conventional product) which the present inventors had studied prior to the present invention. Insulating films (solder resists) 4 and 5 are formed on a main surface (upper surface) and a back surface, respectively, of the wiring substrate 1 in accordance with predetermined patterns, and the semiconductor chip 3 is fixed through the adhesive 2 onto the insulating film 4 formed on the main surface of the wiring substrate 1.

Electrodes (not shown) formed on the semiconductor chip and electrodes 7b formed on the main surface of the wiring substrate 1 are interconnected through conductive wires. For this connection it is necessary that the electrodes 7b be exposed to the main surface of the wiring substrate 1. As a structure for exposing the electrodes 7b there generally is adopted such a structure as shown in FIG. 34 or 35. In the structure of FIG. 34, the insulating film 4 on the main surface of the wiring substrate 1 is removed by a predetermined width to form an opening groove 9, in which the electrodes 7b are positioned. In the structure of FIG. 35, insulating film portions which cover the electrodes 7b are removed, allowing the electrodes 7b to be exposed. As the adhesive 2 there is used an epoxy resin (paste).

In such structures, a sufficient distance between a chip end and the electrodes 7b on the wiring substrate 1 is ensured to prevent contamination of the electrodes 7b even if the adhesive 2 which fixes the semiconductor chip 3 onto the wiring substrate flows out from the chip end, as shown in FIGS. 34 and 35. As an example, in the structure of FIG. 34 having the opening groove 9, the distance a between a chip end and an edge of the opening groove 9 is set as long as 0.50 mm, while in the structure of FIG. 35, the distance b between a chip end and an edge of the insulating film 5 is set as long as 0.525 mm. In both structures, the distance m between the chip end and an end of the wiring substrate 1 is 1.10 mm.

The thickness, f, of the wiring substrate 1 is about 0.210 mm, the thickness, h, of the insulating film 4 is about 0.30 mm, the thickness, g, of the insulating film 5 is about 0.30 mm, the thickness, j, of the semiconductor chip 3 is about 0.22 mm, and the thickness, k, of the adhesive portion where the semiconductor chip 3 is bonded to the wiring substrate 1 is about 0.025 mm.

As another structure for preventing the contamination of electrodes on a substrate caused by flowing out of an adhesive there is known such a structure as shown in FIG. 36. FIG. 36 illustrates a second conventional product which the present inventors had studied prior to the present invention. In this second conventional product, for preventing the contamination of electrodes 7b on a main surface of a wiring substrate 1 caused by an adhesive 2, an insulating film 4a is laminated onto and along an inner periphery edge of the opening groove 9 formed in an insulating film 4 on the main surface of the wiring substrate 1 and is used as a dam for preventing the adhesive 2 from flowing into the groove 9.

Further, having made a private search of prior art literatures from the standpoint of preventing the contamination of electrodes on a main surface of a substrate caused by protrusion of a chip bonding adhesive, the following prior art literatures were extracted: Japanese Unexamined Patent Publication Nos. Hei 8(1996)-181166, Hei 7(1995)-45641, Hei 8(1996)-167678, and 2000-286271.

On the other hand, as a semiconductor device manufacturing method there is known a block molding method. The block molding method comprises mounting semiconductor chips respectively on plural product forming areas of a wiring substrate, then placing the wiring substrate within a molding die having a large cavity which covers the plural product forming areas, then block-molding the plural product forming areas with a sealing resin, and subsequently cutting both seal member and wiring substrate together into individual pieces by a dicing device. The block molding method is described, for example, in Japanese Published Unexamined Patent Application No. 2000-12578 (U.S. Pat. No. 6,200,121).

In the block molding method, after sealing with a sealing resin, both seal member and substrate are cut into individual pieces by a dicing device. As a result of being cut by the dicing device, the seal member is cut vertically and is hence free of any tapered portion. Moreover, since both seal member and substrate are cut simultaneously, the substrate is not required to have an allowance for cut. Consequently, it is possible to shorten the distance between a chip end and a substrate end and hence possible to reduce the size of product (semiconductor device). For example, the distance between a chip end and a substrate end is 800 μm in an embodiment.

SUMMARY OF THE INVENTION

In the semiconductor device manufacturing method which adopts the above block molding method there is a problem that voids are apt to be formed at corner portions defined by side faces of the chip and a main surface of the substrate. For avoiding this problem it is necessary that the space between a back surface of the chip and the main surface of the substrate be filled with a chip bonding adhesive in a more positive manner. To this end it is necessary to control the amount of the adhesive so that the adhesive protrudes at a portion of 70% or more of chip end faces.

In the dicing step after block molding, the interface between the substrate main surface and the seal member is damaged by dicing, but for preventing a defect such as peeling of the substrate from the interface it is necessary that the portion, where the substrate-side wiring lines weak in bonding force for bonding with the seal member are exposed onto the chip main surface, should be spaced as far as possible from end portions of the substrate. For example, it is preferable that the width of an insulating film (solder resist) which covers wiring lines along end portions of the substrate be 200 μm or more.

It has newly been found out that various problems arise in case of forming a semiconductor device by the above block molding method and if an attempt is made to adopt a conventional means for preventing the contamination of electrodes on a wiring substrate caused by protrusion of an adhesive.

The means adopted for the foregoing first conventional product is disadvantageous for the reduction in size of a desired product (semiconductor device) by adoption of the block molding method because the distance between a chip end and electrodes is large. For attaining a further reduction of size in accordance with the means it is necessary to shorten the distance from an end portion of each electrode on the wiring substrate up to an end portion of the substrate. However, shortening the distance from the electrode end to the substrate end is very disadvantageous when a countermeasure to the foregoing peeling of the substrate caused by dicing damage is to be taken into account.

In the foregoing second conventional product, the adhesive protruding distance can be restricted by an insulating film (solder resist) formed in a dam shape, but particularly in the block molding method, in order to surely prevent a sufficient protrusion of the adhesive from the chip end so as to prevent the formation of voids, it is necessary to ensure a sufficient area between the chip end and the dam, which is also disadvantageous for the reduction in size. If the area between the chip end and the dam is made too narrow for attaining a desired reduction in size by adopting the block molding method, there will occur a phenomenon such that the adhesive confined to the narrow area and having nowhere to go crawls up onto the upper portion of the dam or onto the main surface of the chip. As a result, there arises such a problem as shown in FIG. 37 that at chip bonding, an adhesive 2 comes into contact with a bonding tool (collet: pyramidal collet) 10 performing vacuum adsorption holding of a semiconductor chip 3 and contaminates the bonding tool.

It is an object of the present invention to provide a suitable adhesive protrusion preventing method in the manufacture of a semiconductor device which adopts a block molding method.

It is another object of the present invention to provide a semiconductor device manufacturing method which can reduce the manufacturing cost of a semiconductor device.

The above and other objects and novel features of the present invention will become apparent from the following description and the accompanying drawings.

The following is a brief description of typical inventions disclosed herein.

(1) A semiconductor device comprising:

a wiring substrate having a main surface, an insulating film formed on the main surface, and plural electrodes formed on the main surface;

a semiconductor chip having a main surface and a back surface, further having plural semiconductor elements and plural electrodes both formed on the main surface, the semiconductor chip being fixed to the wiring substrate in a state in which the back surface thereof confronts the main surface of the wiring substrate;

conductive wires for connecting the electrodes on the main surface of the wiring substrate with the electrodes on the semiconductor chip; and a seal member which covers the semiconductor chip, the main surface of the wiring substrate, and the electrodes, wherein the electrodes on the wiring substrate are arranged around the semiconductor chip, wherein the insulating film has a first portion formed between the semiconductor chip and the main surface of the wiring substrate, a second portion formed between an outer periphery of the semiconductor chip and the electrodes on the wiring substrate, and a groove formed between the first portion and the second portion, and wherein the seal member and the wiring substrate have side faces cut by dicing.

Such a semiconductor device is manufactured by a method comprising the steps of:

providing a wiring substrate on which plural product forming areas are arranged in regular order, the wiring substrate having wiring lines on both a main surface thereof in the product forming areas and a back surface thereof opposite to the main surface, the wiring lines on the main surface and the back surface being electrically connected with each other through conductors;

fixing semiconductor chips respectively to the product forming areas on the main surface of the wiring substrate through a pasty adhesive;

connecting electrodes formed on an upper surface of each of the semiconductor chips and electrodes formed on the main surface of the wiring substrate electrically with each other through conductive wires;

clamping the wiring substrate between a lower mold and an upper mold of a molding die in a transfer molding apparatus to form a block molding package on the main surface side of the wiring substrate so as to cover each of the semiconductor chips and each of the connecting means; and dividing the wiring substrate and the block molding package, which are superimposed one on the other, longitudinally and transversely at predetermined positions to form plural semiconductor devices, wherein in each of the product forming areas, a groove is formed between the electrodes formed on the main surface of the wiring substrate and each of semiconductor chip mounting portions for mounting the semiconductor chips, allowing a protruding portion of the pasty adhesive flowing out to the outside of each of the semiconductor chips when the semiconductor chips are fixed to the wiring substrate to stay in the groove so as not to reach the electrodes.

According to the above semiconductor device (1) adopting the block molding method wherein (a) the seal member and the wiring substrate have side faces cut by dicing, since a groove formed by removing the insulating film is provided between the semiconductor chip fixed to the wiring substrate through an adhesive and electrodes formed on the main surface of the wiring substrate, the adhesive which has protruded stays within the groove and does not reach the electrodes on the main surface of the wiring substrate, so that the connection reliability of the wires connected to the electrodes is improved. Consequently, the yield in the manufacture of the semiconductor device is also improved.

(b) By adopting the construction wherein a groove is formed to let a protruding portion of the adhesive stay therein, it is possible to shorten the distance between an inner periphery of the groove and the semiconductor chip in comparison with the prior art, so that the reduction in size of the semiconductor device can be attained also in the semiconductor device manufacturing method which adopts the block molding method.

(c) By ensuring a predetermined distance between an outer periphery of the groove and an end of the wiring substrate, it is possible to ensure a required bonding force between the wiring substrate and the seal member and hence possible to prevent the deterioration of moisture resistance caused by peeling between the wiring substrate and the seal member. That is, by adopting the adhesive protrusion preventing construction using the groove, it is possible to shorten the distance between the chip end and the electrodes on the substrate, and even in a limited size of the semiconductor device formed by the block molding method, the width of the insulating film (solder resist) which covers wiring lines along substrate ends can be set at a value sufficient to prevent peeling of the substrate, that is, 200 μm or more for example. Moreover, the distance from end faces of the wiring substrate and the seal member to an end face of the semiconductor chip becomes as short as 0.8 mm or so, thus permitting the reduction in size of the semiconductor device.

(d) As to forming the groove in the insulating film (solder resist film), since it can be formed simultaneously with the step of forming an opening for the exposure of electrodes on the substrate which insulating film is disposed between the back surface of the chip and the wiring lines on the substrate for the purpose of insulation between the two, the formation of the groove can be done in a simpler step than in case of forming a dam-like structure with use of an insulating film in a partially overlapped state.

(e) Since the insulating film (solder resist) is formed on both surfaces (main surface and the back surface) of the substrate, even if internal stresses are present in the solder resists, they are offset at both surfaces, whereby the warp of the substrate can be prevented to realize a semiconductor device superior in quality.

(f) By allowing a protruding portion of the adhesive to stay within the groove, it is possible to prevent the adhesive from crawling up more than necessary onto side faces of the chip. Therefore, at the time of holding the semiconductor chip with use of a pyramidal collet in chip bonding, the collet becomes difficult to be stained by the adhesive, so it is possible to prevent a lowering of yield in chip bonding caused by stain of the collet and hence possible to prevent an increase in the semiconductor device manufacturing cost caused by a lowering of yield.

(g) The insulating film extending between the semiconductor chip and the wiring substrate makes it possible to prevent shorting of plural wiring lines.

(h) Since the adhesive for bonding the semiconductor chip to the wiring substrate also covers each end face of the semiconductor chip over an area of 70% or so of the chip end face, the chip end face becomes difficult to involve air therein in the flow of sealing resin and therefore it becomes difficult for voids to occur.

(i) In the semiconductor device manufacturing method, there is used a wiring substrate on which plural product forming areas are arranged longitudinally and transversely in regular order, and semiconductor chips are fixed respectively to the product forming areas through an adhesive, but in this fixing step the adhesive which has protruded enters the groove and does not flow out beyond the groove, so that the electrodes formed on the main surface of the wiring substrate are not stained by the adhesive. Therefore, wires can be fixed positively to the electrodes on the main surface of the wiring substrate and a semiconductor device high in the reliability of wire bonding can be manufactured in high yield. Besides, it is possible to attain the reduction in cost of the semiconductor device.

BRIEF DESCRIPTION OF THE DRAWINGS

FIG. 16(*b*) is a schematic diagram showing in what state a semiconductor chip is fixed onto the substrate in the semiconductor device manufacturing method according to the first embodiment;

FIG. 16(*c*) is a schematic diagram showing in what state a semiconductor chip is fixed onto the substrate in the semiconductor device manufacturing method according to the first embodiment;

FIG. 21 is a front view of the substrate which has been subjected to block molding;

FIG. 22 is a plan view thereof;

DETAILED DESCRIPTION OF THE PREFERRED EMBODIMENTS

Figure 1:
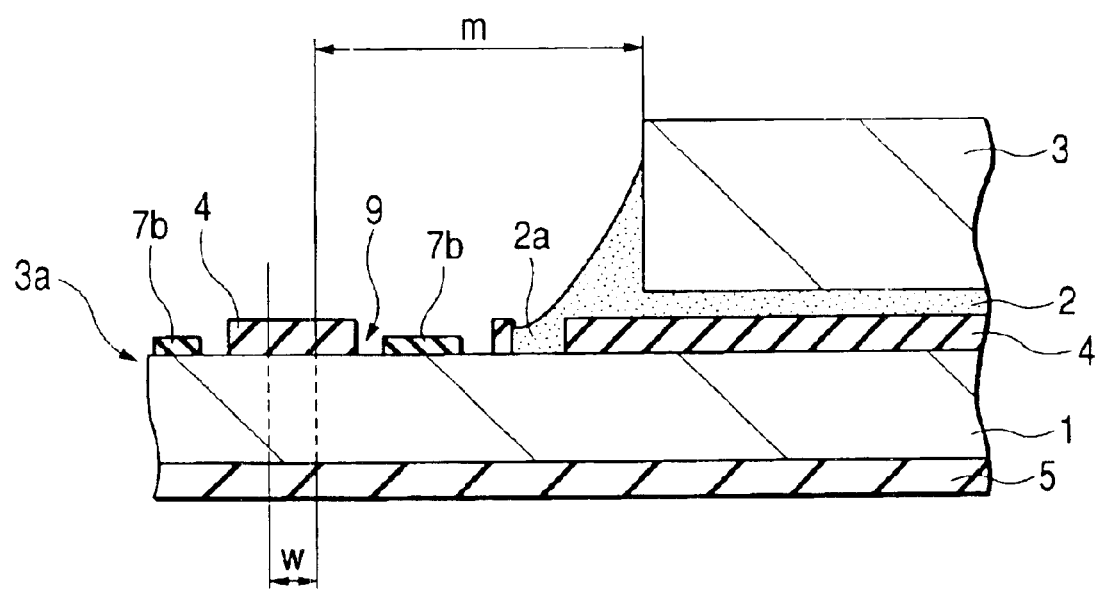
FIG. 1 is a schematic diagram showing a fixed state of a chip which could prevent flowing-out of an adhesive in a method of manufacturing a semiconductor device according to an embodiment (first embodiment) of the present invention.
Figure 2:
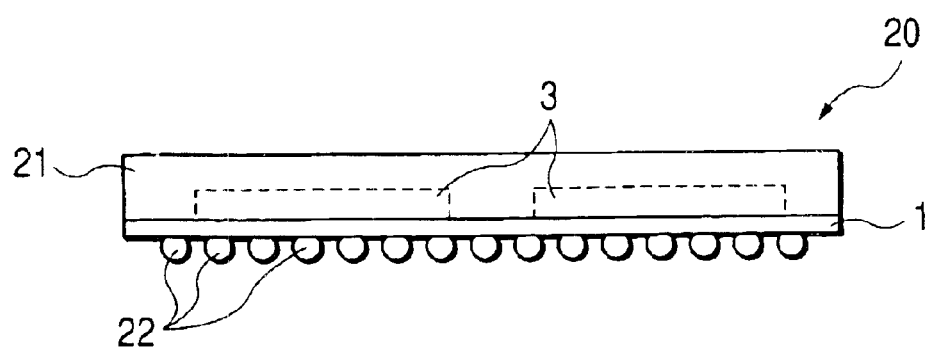
FIG. 2 is a front view of a semiconductor device manufactured by the semiconductor manufacturing method according to the present invention.

Embodiments of the present invention will be described in detail hereinunder with reference to the accompanying drawings. In all of the drawings for explaining the embodiments, portions having the same functions are identified by the same reference numerals and repeated explanations thereof will be omitted.

First Embodiment

FIGS. 1 to 25 illustrate an MAP type semiconductor device and a method of manufacturing the same according to an embodiment (first embodiment) of the present invention. In the first embodiment the present invention is applied, though not specially limited, to a memory semiconductor device with two semiconductor chips mounted side by side thereon, the semiconductor chips each constituting a 64 MDRAM. FIGS. 1 to 7 are concerned with a structure of the semiconductor device, while FIGS. 8 to 25 are concerned with a method of manufacturing the semiconductor device.

Figure 3:
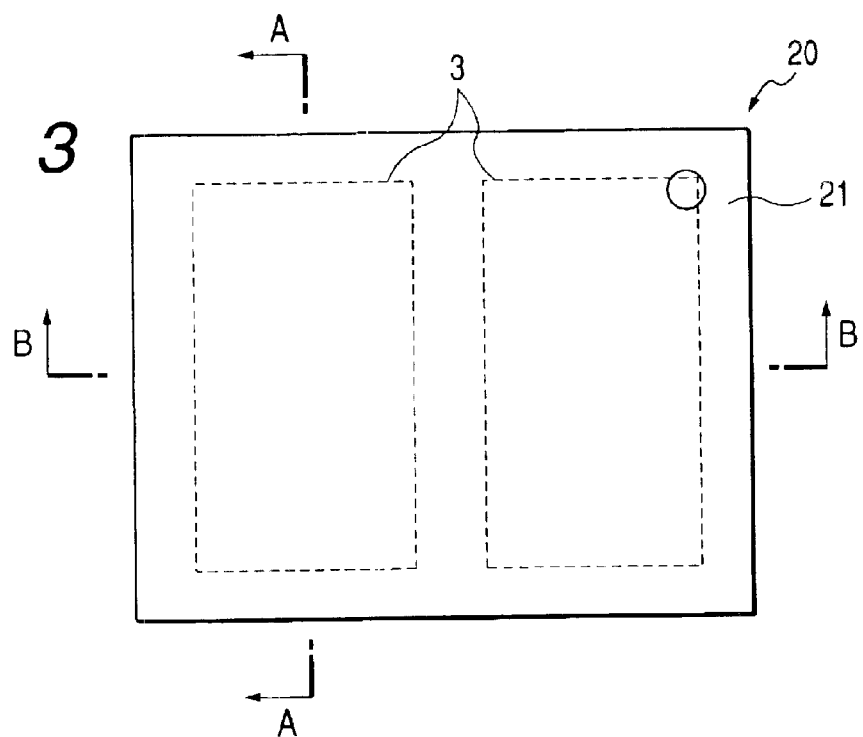
FIG. 3 is a plan view of the semiconductor device according to the first embodiment.
Figure 4:
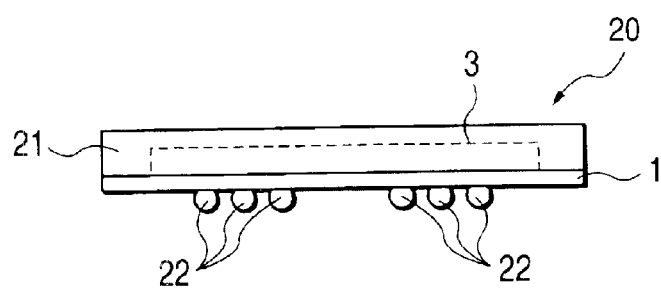
FIG. 4 is a side view thereof.
Figure 5:
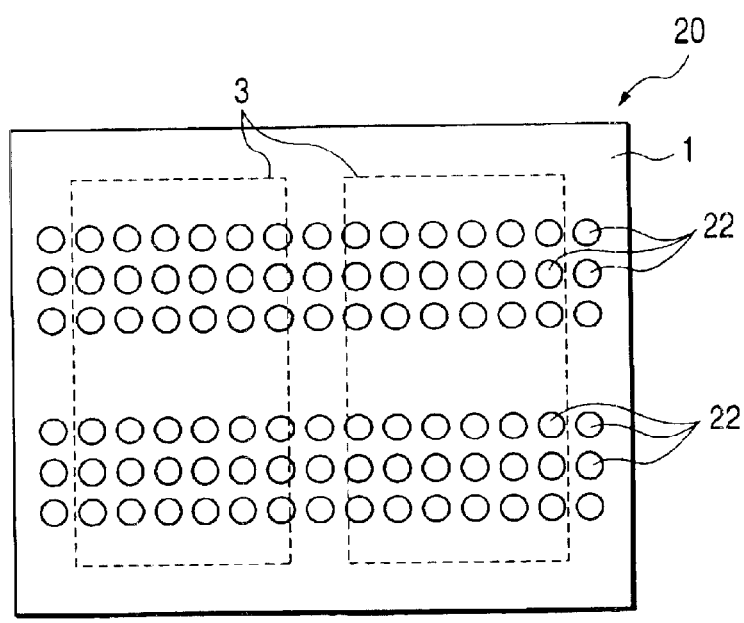
FIG. 5 is a bottom view thereof.
Figure 6:
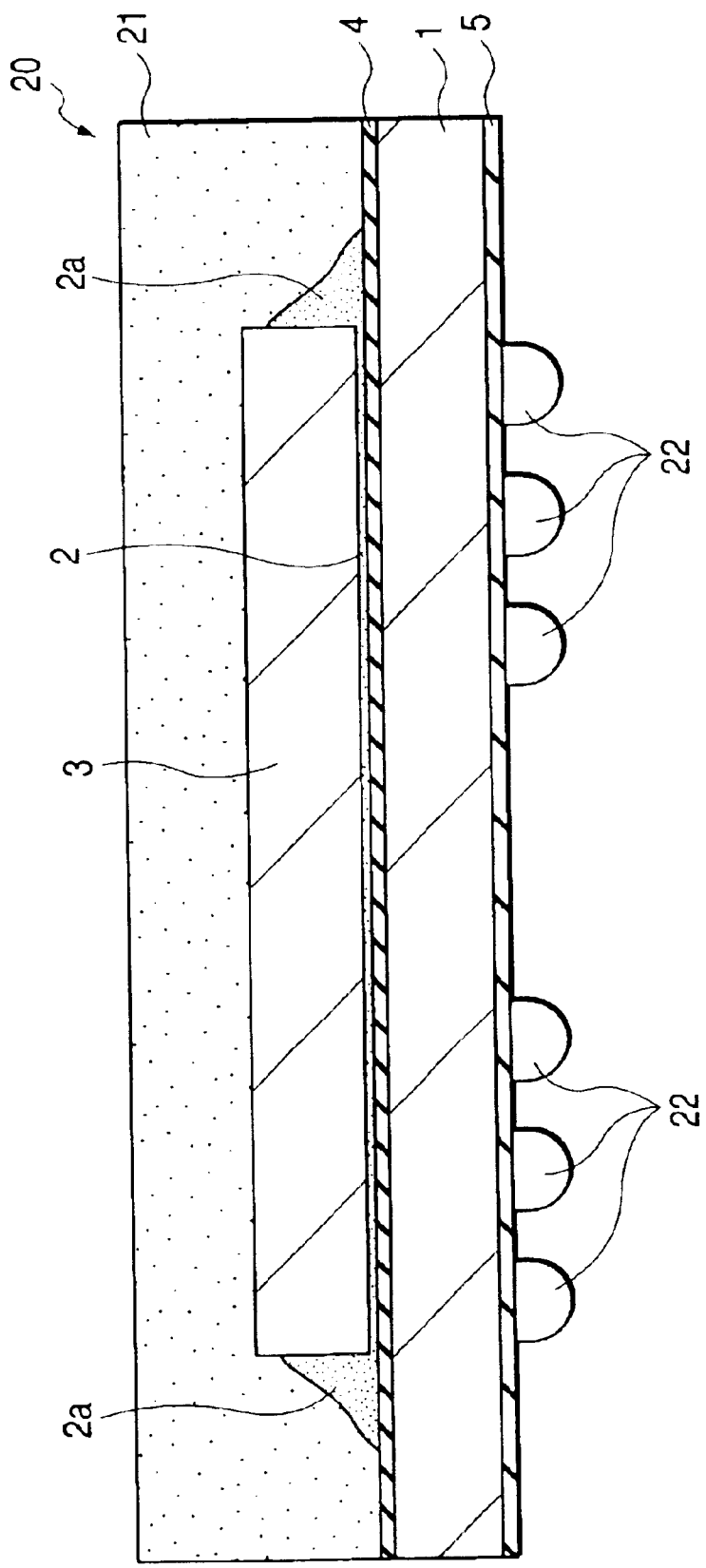
FIG. 6 is an enlarged sectional view taken on line A-A in FIG. 3.
Figure 7:
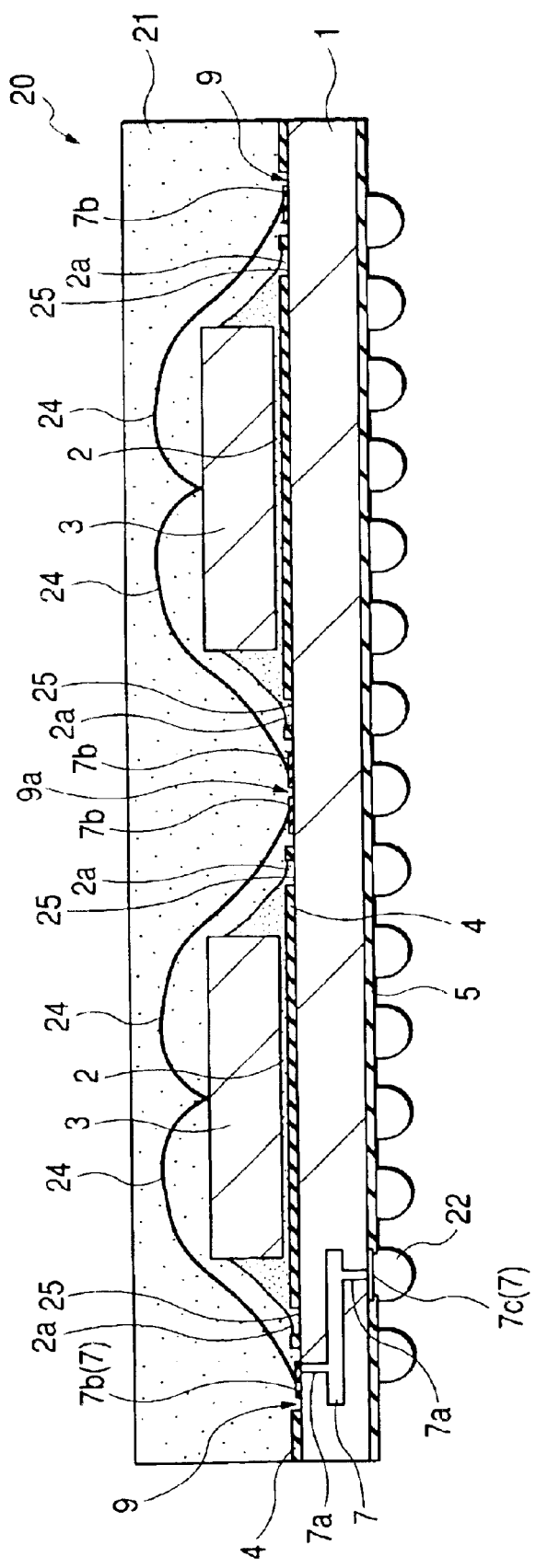
FIG. 7 is an enlarged sectional view taken on line B-B in FIG. 3.

The semiconductor device of the first embodiment is of such a structure as shown in FIGS. 2 to 7, of which FIGS. 2, 3, 4, and 5 are a front view, a plan view, a side view, and a bottom view, respectively, of the semiconductor device, FIG. 6 is an enlarged sectional view taken along line A—A in FIG. 3, and FIG. 7 is an enlarged sectional view taken along line B—B in FIG. 3.

As shown in FIGS. 2 to 5, the semiconductor device 20 comprises, in appearance, a quadrangular wiring substrate 1, a seal member 21 superimposed on a main surface (upper surface in FIG. 2) of the wiring substrate 1 and having the same external size as the wiring substrate, and plural salient electrodes 22 formed on a back surface (lower surface in FIG. 2) of the wiring substrate 1 opposite to the main surface.

As shown in FIG. 7, the wiring substrate 1 has a multilayer structure wherein wiring lines 7 of predetermined patterns are formed in both main surface and back surface of the wiring substrate 1 and also in one or plural intermediate layers, and upper and lower wiring lines 7 are connected together electrically by conductors 7a (wiring lines) filled in through holes. For example, the wiring substrate 1 is a glass fabric-based epoxy resin substrate. On the main surface of the wiring substrate 1 the wiring lines 7 constitute electrodes 7b for the connection of wires 24, while on the back surface of the wiring substrate there are formed electrodes 7c which serve as pedestals for fixing the salient electrodes 22.

Two semiconductor chips 3 are mounted on the main surface of the wiring substrate 1 and the electrodes 7b for the connection of wires are arranged around chip mounting areas for mounting the chips 3. Arrangement patterns of the electrodes 7c serving as pedestals for fixing the salient electrodes 22 are such patterns as shown in FIG. 5.

Figure 8:
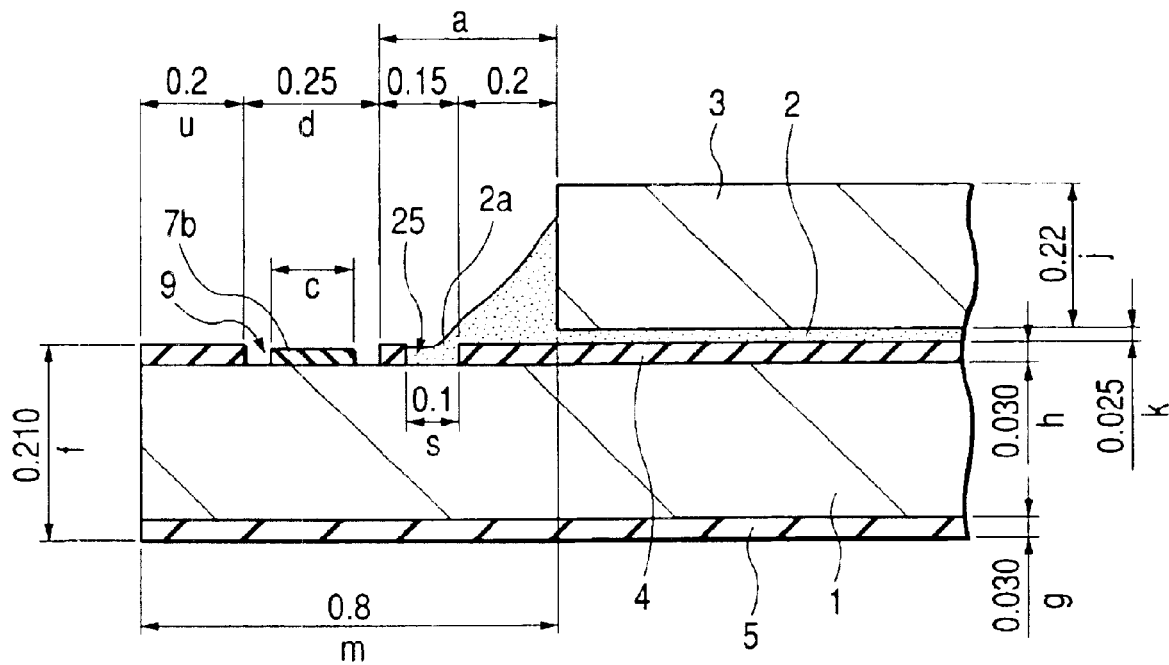
FIG. 8 is a schematic sectional view showing a dimensional relation between an end portion of a semiconductor chip and a groove, etc. in the semiconductor device according to the first embodiment.

FIG. 8 is an enlarged sectional view showing a part of FIG. 7. More specifically, FIG. 8 is an enlarged sectional view of a portion from one end of the semiconductor device 20, i.e., one end of the wiring substrate 1, up to an end portion of a semiconductor chip 3. In this figure, the seal member 21, wires 24, conductors 7a, electrodes 7c, and salient electrodes 22 are omitted.

On the main surface (upper surface) and back surface of the wiring substrate 1 are formed insulating films (solder resists) 4 and 5 in accordance with respective predetermined patterns so as to cover the wiring lines, etc. The electrodes 7b on the main surface of the wiring substrate are exposed so as to permit wire bonding and the electrodes 7c on the back surface of the wiring substrate are exposed for fixing the salient electrodes 22.

Figure 9:
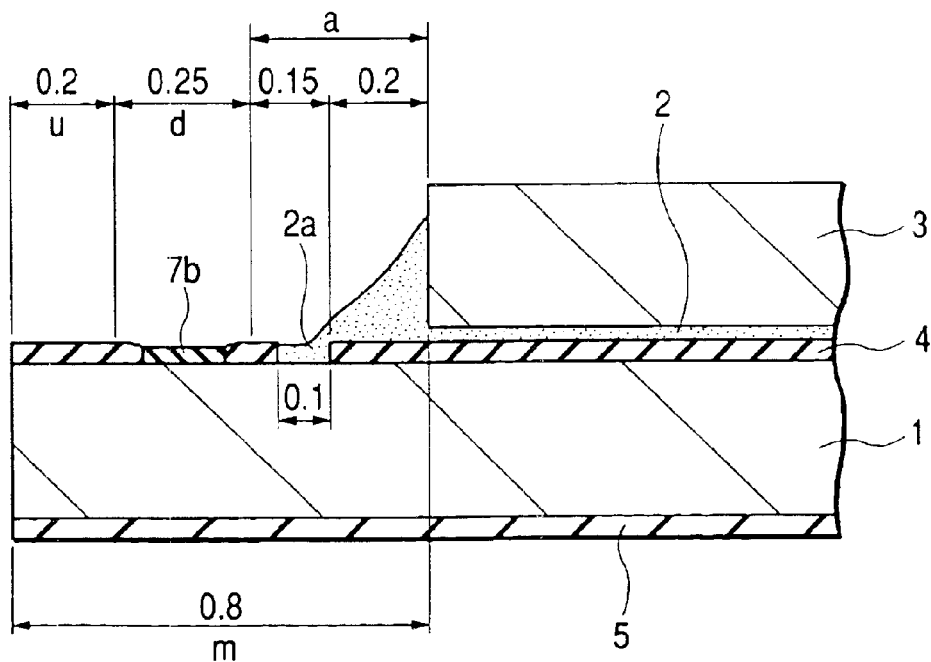
FIG. 9 is a schematic sectional view of another substrate, showing a dimensional relation between an end portion of a semiconductor chip and a groove in the semiconductor device according to the first embodiment.
Figure 10:
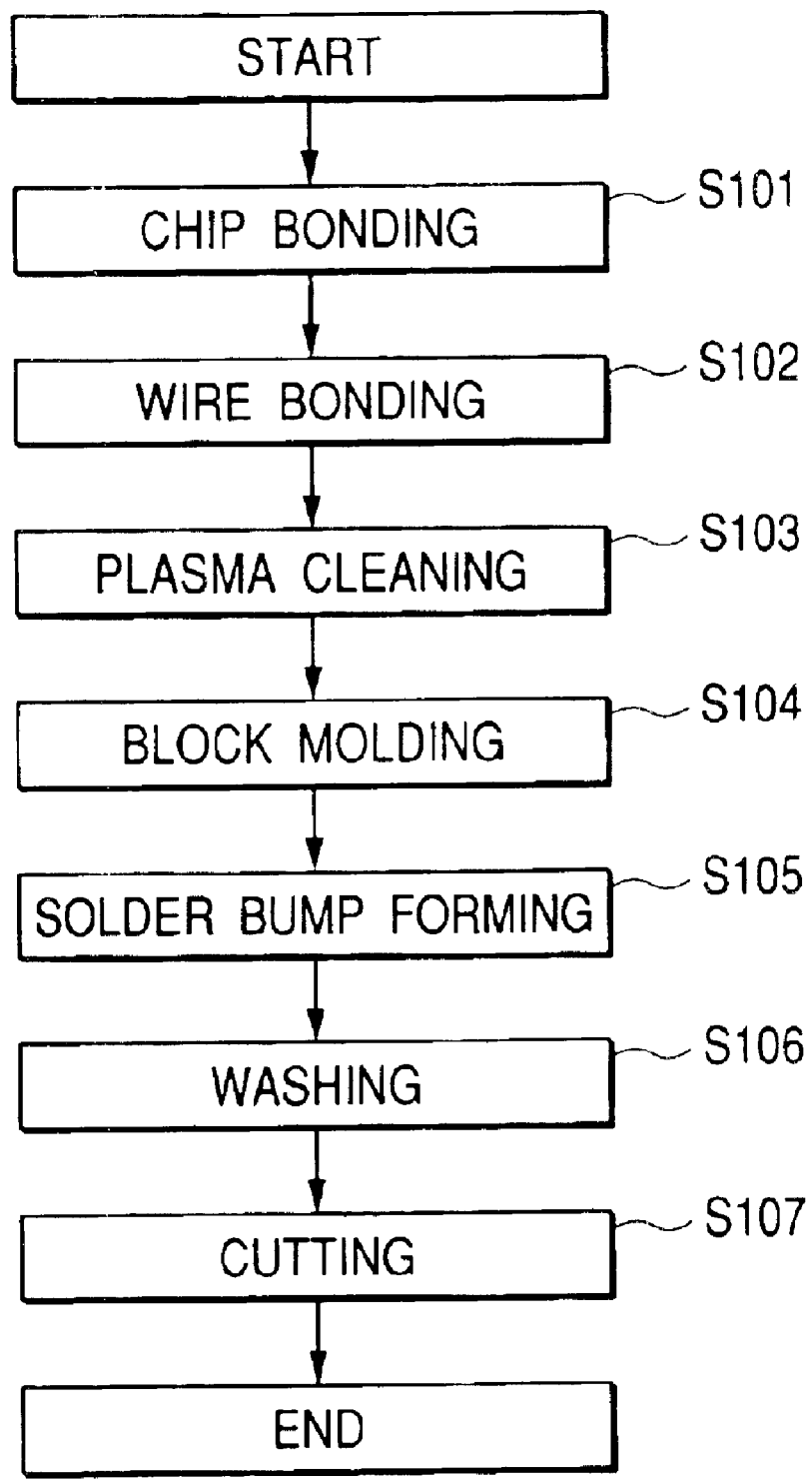
FIG. 10 is a flow chart showing the semiconductor device manufacturing method according to the first embodiment.

In both structures shown in FIGS. 8 and 9, the electrodes 7b are exposed to permit wire bonding. More specifically, in FIG. 8, for exposing the electrodes 7b, the insulating film 4 is removed over a predetermined certain width to form an opening groove 9, and the electrodes 7b are arranged along the center of the opening groove 9. In FIG. 9 an aperture is formed in an insulating film for each electrode and side faces of each electrode 7b are covered with the insulating film 4. Although the present invention will be described below with reference to the example of having an opening groove shown in FIG. 8, there will be obtained the same effect even in case of using the wiring substrate 1 of the structure shown in FIG. 9.

As shown in FIG. 7, quadrangular semiconductor chips 3 are fixed through an adhesive 2 onto the insulating film 4 formed on the main surface of the wiring substrate 1. As the adhesive 2 there is used, for example, an insulating epoxy resin (paste). After fixing the semiconductor chips 3 through the adhesive 2, the adhesive 2 is cured at a temperature of about 150° C. The insulating film 4 on the main surface of the wiring substrate functions to prevent shorting of plural wiring lines through the back surface of each semiconductor chip 3.

On the other hand, the insulating film 4 located between the opening groove 9 and the fixed portion of each semiconductor chip 3 is partially removed in its full depth direction (throughout the depth) to form a groove 25 which extends through the insulating film. This is one of features of the present invention. The groove 25 functions to prevent flowing-out of the adhesive 2 which is for fixing the semiconductor chip 3. Wiring lines on the wiring substrate 1 are exposed to the bottom of the groove 25 (see FIG. 12). In more particular terms, the groove 25 spans between the back surface of the semiconductor chip 3 and the main surface of the wiring substrate 1.

The adhesive 2 for fixing each semiconductor chip 3 preferably adheres in a somewhat raised state also to a peripheral surface of the semiconductor chip. This is preferable because voids are difficult to be formed in a peripheral edge portion of the semiconductor chip 3 during transfer molding which forms the seal member 21. That is, if the peripheral surface of the semiconductor chip 3 is sloped as a gentle slope surface by the raised portion of the adhesive 2, air becomes difficult to be involved in the chip peripheral surface which is hidden by the flow of resin, whereby the formation of voids can be prevented. For this reason it is preferable that the adhesive protrude over an area of 70% or more of the chip peripheral surface.

However, if the adhesive is raised at end faces of each chip, there is a fear that a protruding portion 2a of the adhesive may reach the electrodes 7b. Particularly, if the distance a, (see FIG. 8) from a chip end face to an edge (inner wall) of the insulating film where the opening groove 9 is formed is short, the protruding portion 2a of the adhesive will reach the electrodes 7b easily and cover the surfaces of the electrodes 7b, so that it becomes impossible to effect wire bonding positively.

Figure 34:
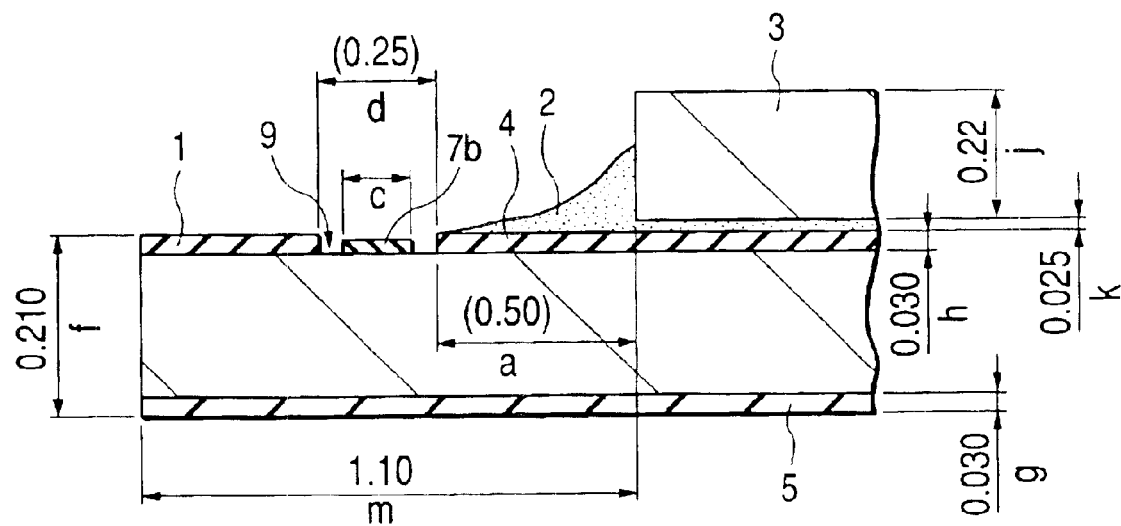
FIG. 34 is a plan view showing a part of a substrate with a semiconductor chip mounted thereon in a conventional semiconductor device manufacturing method.
Figure 35:
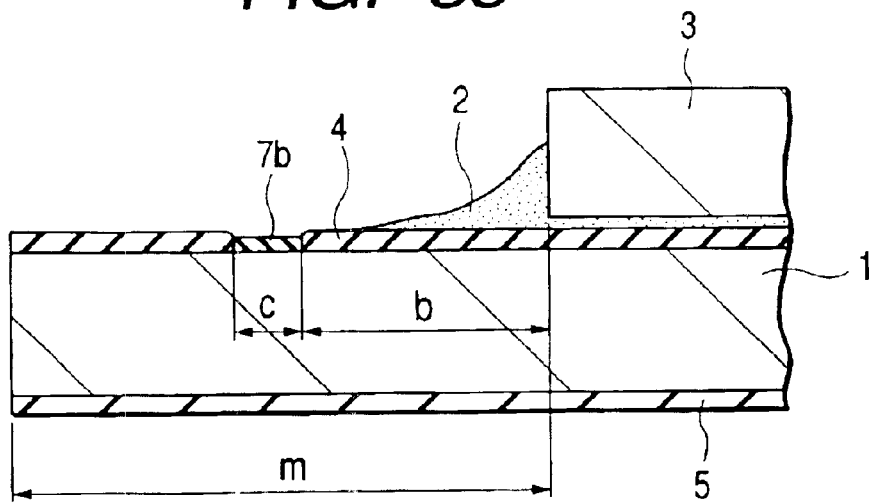
FIG. 35 is a plan view showing a part of another substrate with a semiconductor chip mounted thereon in the conventional semiconductor device manufacturing method.
Figure 36:
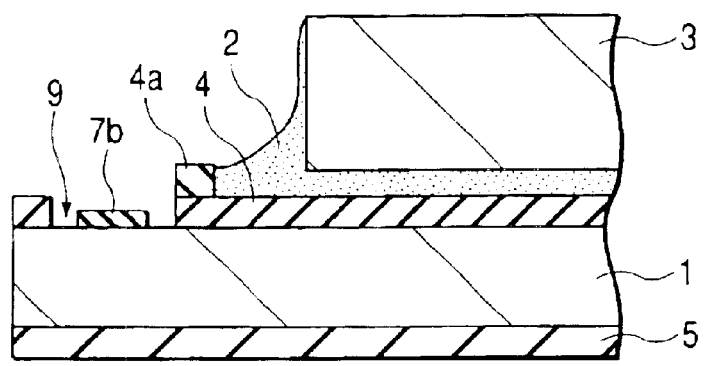
FIG. 36 is a plan view showing a part of a further substrate with a semiconductor chip mounted thereon in the conventional semiconductor device manufacturing method.

In this first embodiment, in view of the point just referred to above, the groove 25 is formed to let the protruding portion 2a of the adhesive stay therein so as not to get over the groove. With this structure, the distance a from the chip end face to the inner wall of the opening groove 9 can be shortened from 0.50 mm in FIG. 34 to 0.35 mm. Further, by shortening the distance from an outer wall of the opening groove 9 to an end of the wiring substrate 1, the distance m from the chip end face to the end of the wiring substrate can be shortened from 1.10 mm in FIG. 34 to 0.8 mm, with the result that the semiconductor device 20 can be made smaller by 0.6 mm. These numerical values are not absolute, but by adopting the structure of this first embodiment it is possible to attain the reduction in size of the semiconductor device in comparison with the semiconductor device shown in FIG. 34.

The distance u from the outer wall of the opening groove 9 to the end of the wiring substrate 1 is greatly related to the bonding strength of the seal member 21 which adheres closely to the wiring substrate, and the longer the distance u the higher the bonding strength. In this case, the insulating film 4 located between the groove 25 and the opening groove 9 also contributes to the enhancement of the bonding strength.

It follows that the longer the distance u the better, for preventing peeling between the seal member 21 and the wiring substrate 1 and for improving the moisture resistance of the semiconductor device 20. Following this conclusion would make it impossible to attain the reduction in size of the semiconductor device 20. In this embodiment, experiments were repeated to solve this problem and obtain a bonding strength which does not deteriorate the moisture resistance of the semiconductor device 20. As a result, it turned out that no problem occurred even when the distance u was set at 0.2 mm for example. Therefore, a decision was made to use this value.

It has also turned out that if the proportion of the protruding portion of the adhesive protruding to the peripheral surface of the semiconductor chip 3 is set at 70% or so, the adhesive does not adhere to the collet surface that holds the semiconductor chip during chip bonding, making it possible to prevent contamination of the collet.

As will be described later, the adhesive 2 for fixing the semiconductor chip 3 is fed in a highly accurate quantity onto the main surface of the wiring substrate 1 by means of a dispenser. Therefore, it is also possible to estimate the amount of protrusion of the adhesive 2 accurately. Thus, if a sectional area (volume) of the groove 25 is set so as to give a predetermined volume, it is possible to prevent the protruding portion 2a of the adhesive from getting over the groove 25, that is, the protruding portion can be allowed to stay within the groove 25.

An example of dimensions which satisfy the aforesaid conditions is illustrated in FIG. 8. That is, the thickness f of the wiring substrate 1 is 0.210 mm, the thickness h of the insulating film 4 is 0.30 mm, the thickness g of the insulating film 5 is 0.30 mm, the thickness j of the semiconductor chip 3 is 0.22 mm, the thickness k of the adhesive portion for bonding the semiconductor chip 3 to the wiring substrate 1 is 0.025 mm, the distance m from an end face of the chip to an end of the wiring substrate 1 is 0.8 mm, the distance a from the chip end face to an inner wall of the opening groove 9 is 0.35 mm, the width d of the opening groove 9 is 0.25 mm, and the length u of the insulating film 4 located the outermost periphery is 0.2 mm. The size of the semiconductor chip 3 is not specially limited, but is 8.2 mm long by 4.6 mm wide.

As shown in FIG. 7, two semiconductor chips 3 are mounted side by side on the wiring substrate. Consequently, wires 24 extend from the electrodes on both semiconductor chips 3 to the central portion between the two chips. For this reason the electrodes 7b are arranged in two rows. The two rows of electrodes 7b are arranged in an opening groove 9a which is wider than the opening groove 9 described previously. The width of the opening groove 9a is 0.25 mm. The spacing between the two rows of electrodes 7b is set to a spacing which does not induce an electrical shorting; for example, it is set at 0.1 mm or more.

Electrodes formed on an upper surface of each semiconductor chip 3 are arranged in a row centrally in the longitudinal direction of the chip though not shown. Therefore, in this first embodiment, two grooves 25 extend longitudinally of the two semiconductor chips 3 and in parallel between the chips. Further, one groove 25 is formed along an outer long side of each semiconductor chip 3. The electrodes 7b formed on the main surface of the wiring substrate are arranged along each groove 25. The electrodes 7b and the electrodes on each semiconductor chip 3 are connected together through conductive wires 24. As the wires 24 there are used gold wires for example.

The two semiconductor chips 3 are covered with the seal member 21 which is formed using an insulating resin throughout the main surface of the wiring substrate. In the semiconductor device manufacturing method according to this first embodiment, two semiconductor chips are mounted in each product forming area on a single large wiring substrate, then a block molding package is formed to a predetermined certain thickness on the main surface side of the wiring substrate using an insulating resin by means of a transfer molding apparatus, and eventually both wiring substrate and block molding package are cut (diced) at an interface between adjacent product forming areas, so that side faces of the seal member 21 are perpendicular to the main surface of the wiring substrate 1.

On the other hand, on the back surface (lower surface in FIG. 2) of the wiring substrate 1 opposite to the main surface there are formed plural salient electrodes 22, which are solder bump electrodes formed by solder balls. As a solder ball there is used, for example, a solder ball having a diameter of 0.35 mm. The salient electrodes 22 project about 0.25 mm from the back surface of the wiring substrate 1 and are arranged in six rows in the longitudinal direction of the wiring substrate. According to the electrode pattern adopted, the electrode rows are divided three rows by three rows so that each group of rows is positioned close to a long side in a symmetrical arrangement, with no electrode present in a central area.

Next, with reference to FIGS. 10 to 25, a description will be given about a method of manufacturing the BGA type semiconductor device 20 according to this first embodiment. As shown in the flow chart of FIG. 10, after the start of work, the semiconductor device 20 is manufactured through the steps of chip bonding (S101), wire bonding (S102), plasma cleaning (S103), block molding (S104), solder bump forming (salient electrode forming; S105), washing (S106), and cutting (S107).

Figure 11:
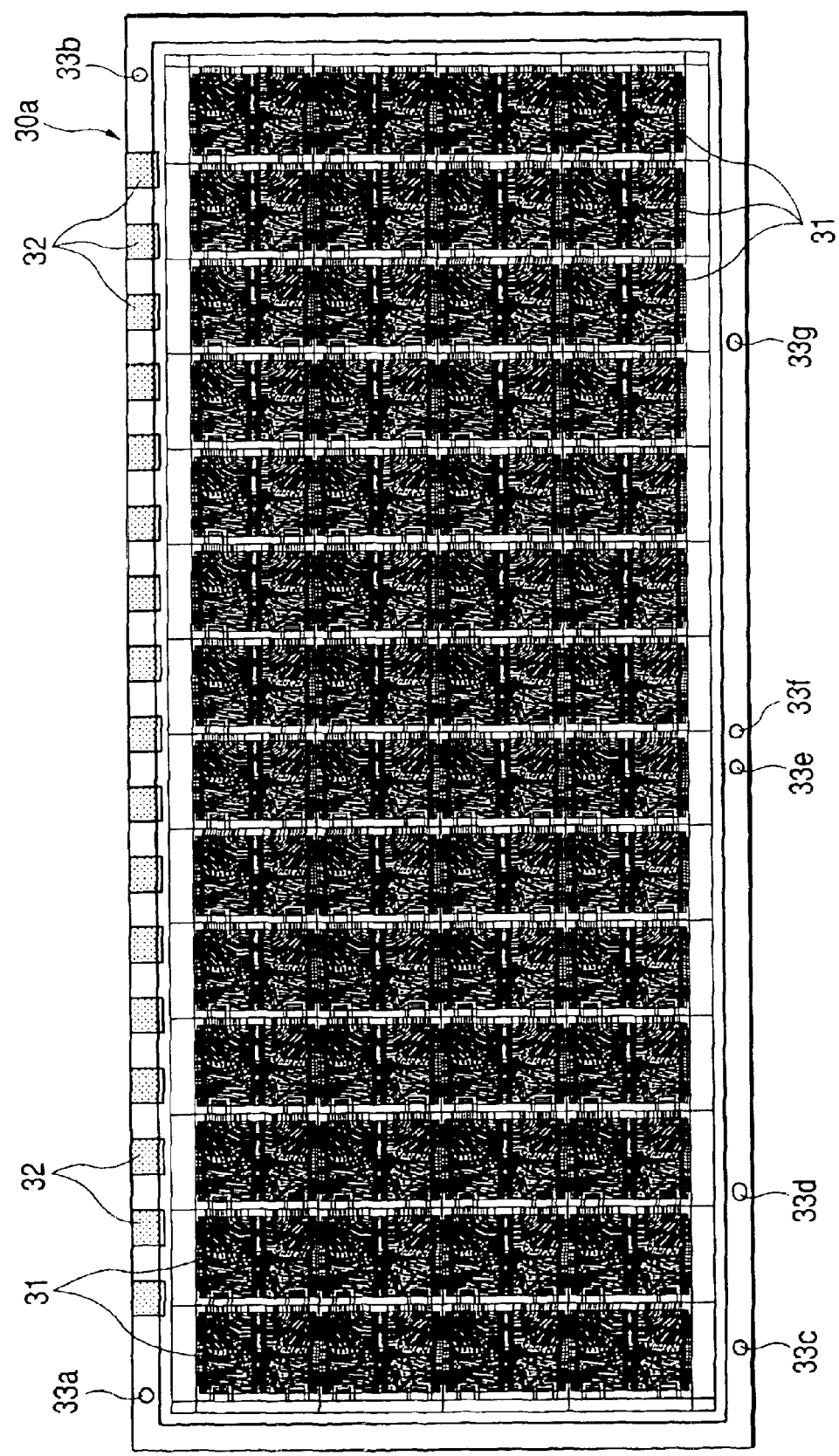
FIG. 11 is a plan view of a wiring board (substrate) used in the semiconductor device manufacturing method according to the first embodiment.
Figure 12:
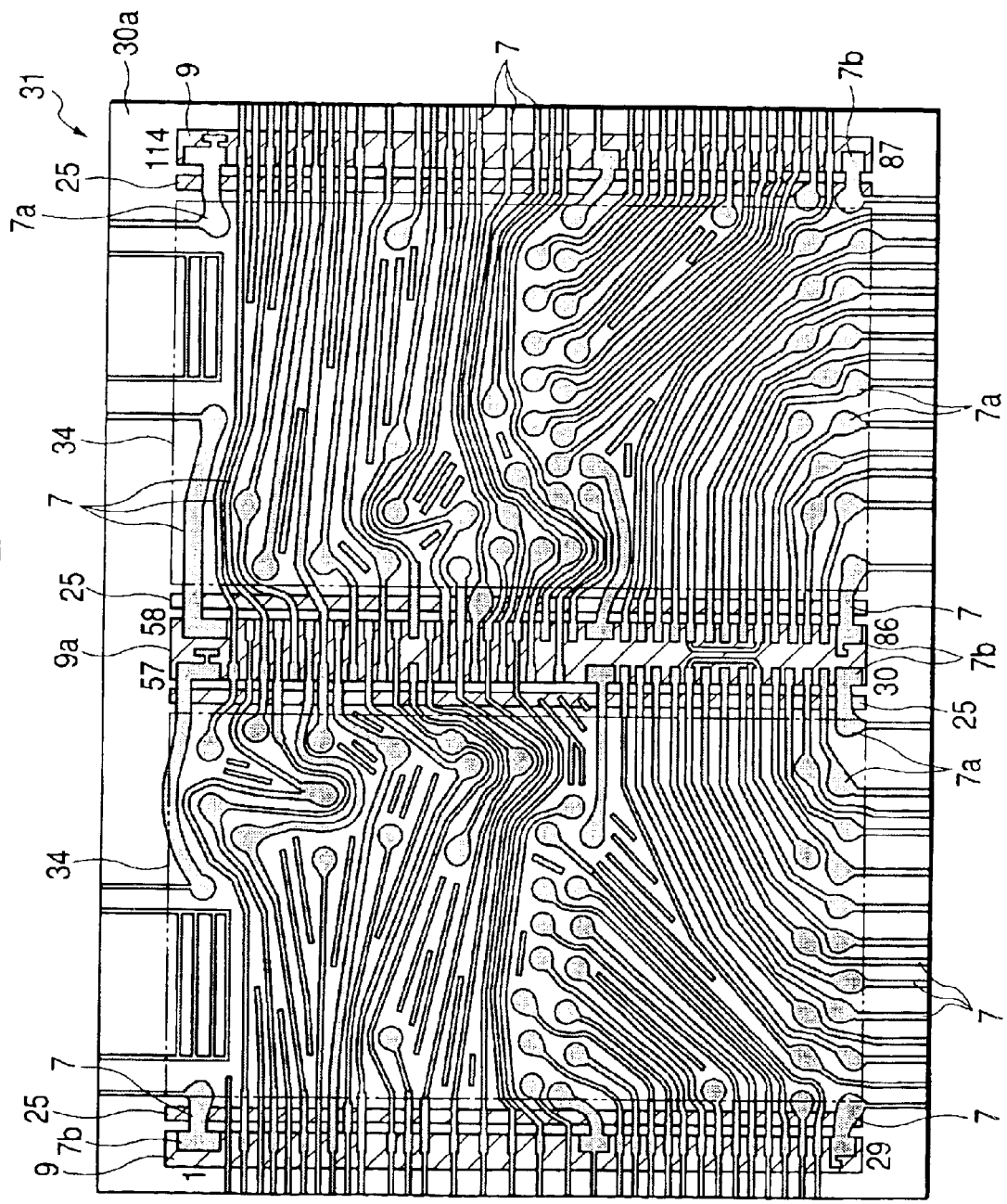
FIG. 12 is a plan view showing a main surface side in a product forming area of the substrate.
Figure 13:
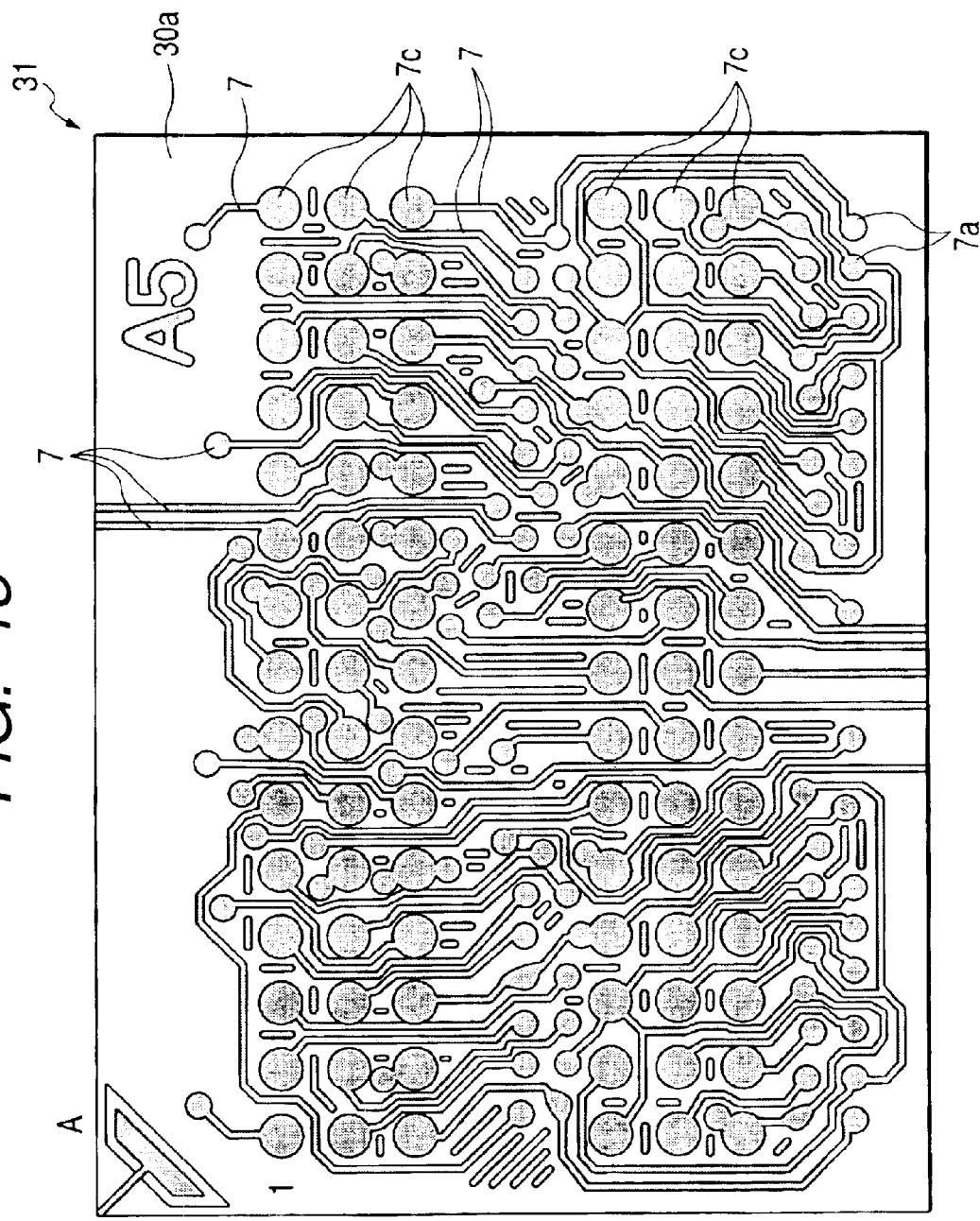
FIG. 13 is a perspective projection of wiring patterns on a back surface side in a product forming area of the substrate opposed to the main surface thereof.
Figure 14:
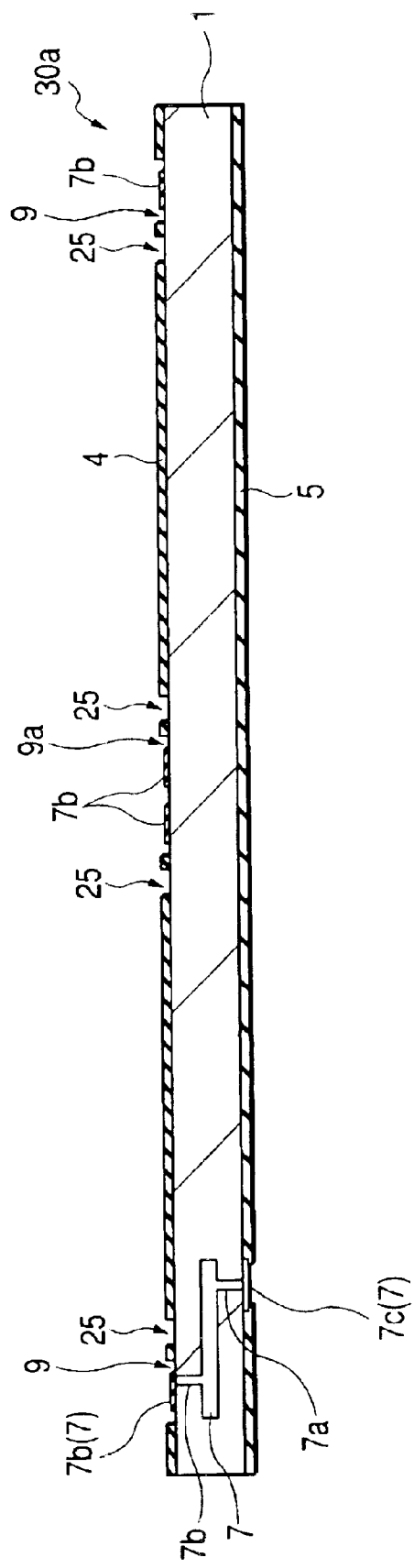
FIG. 14 is an enlarged sectional view showing a part of the substrate.

FIGS. 11 to 14 are concerned with a substrate (wiring substrate) 30a used in manufacturing the semiconductor device 20 of this first embodiment, of which FIG. 11 is a plan view of the substrate 30a, FIG. 12 is a plan view showing a main surface side of a product forming area on the substrate 30a, FIG. 13 is a perspective projection of wiring patterns on a back surface of the product forming area on the substrate 30a opposed to the main surface, and FIG. 14 is an enlarged sectional view showing a part of the substrate 30a.

As shown in FIG. 11, the substrate 30a is in a rectangular shape for example and on a main surface as a semiconductor chip mounting surface of the substrate 30a there are arranged plural product forming areas 31 at predetermined pitches in a matrix shape. For example, the product forming areas 31 are arranged in such a manner that fourteen columns are arranged in the long-side direction of the substrate 30a and four rows are arranged in the short-side direction of the substrate, i.e., 14 columns×4 rows. In the product forming areas 31 are formed wiring patterns, but the wiring patterns are so fine that they are not visible clearly in FIG. 11.

Square portions 32 shown at predetermined intervals on the upper long side of the substrate 30a in FIG. 11 represent gate positions for the injection of resin in a transfer molding apparatus which is used for forming a seal member 21. By arranging the gate positions in a closely spaced state it is possible to prevent the occurrence of unfilled portions of a sealing resin in block molding. In both long sides of the substrate 30a are formed circular or elongated guide holes 33a to 33g, which are used during manufacture, transport, or positioning of the semiconductor device 20.

FIGS. 12 to 14 are concerned with each product forming area 31, of which FIG. 12 is a plan view which illustrates wiring patterns on a main surface side of the product forming area 31 in perspective projection, FIG. 13 is a plan view which illustrates wiring patterns on a back surface of the product forming area 31 in perspective projection, and FIG. 14 is a longitudinal sectional view. The surface and the back (main surface and back surface) of the substrate 30a are covered with insulating films (solder resists) 4 and 5, respectively, as shown in FIG. 14. The insulating films 4 and 5 are omitted in FIGS. 12 and 13.

As shown in FIG. 14, the substrate 30 has a multi-layer structure in which wiring lines 7 of predetermined patterns are formed on both main surface and back surface of the wiring substrate 1 and also in one or plural intermediate layers, the upper and lower wiring lines 7 being electrically connected with each other through conductors 7a (wiring lines) filled in through holes. For example, the substrate 30a is a glass fabric-based epoxy resin substrate. On the main surface of the wiring substrate 1 the wiring lines 7 constitute electrodes 7b for the connection of wires 24, while on the back surface thereof are provided electrodes 7c serving as pedestals for fixing salient electrodes 22. The wiring lines 7 are connected to wiring lines 7 in an adjacent product forming area 31.

As shown in FIG. 12, in each product forming area 31 of the substrate 30a are arranged two chip mounting areas 34 side by side in the longitudinal direction. On both long sides of each chip mounting area 34 are formed opening grooves 9 by removing the insulating film over a certain width and electrodes 7b as portions of the wiring lines 7 are exposed into the opening grooves 9 (see FIG. 14).

The opening groove positioned between both chip mounting areas 34 is formed as a single wide opening groove 9a so that the wire bonding electrodes 7b connected to the semiconductor chips mounted respectively on the two right and left chip mounting areas 34 are both positioned in the groove 9a. That is, within the opening groove 9a are arranged the electrodes 7b in two lines in the extending direction of the groove. The wiring lines 7, which are thin, are made thick in a predetermined length and the thick portions are used as the electrodes 7b.

The thin wiring lines 7 are partially thickened in a circular shape, in which through holes are formed and conductors 7a are provided therein (see FIG. 14). This is also true of FIG. 13. In FIG. 13, through holes are formed in small circular portions, while large circular portions arranged side by side in the longitudinal direction of the product forming area 31 correspond to the electrodes 7c which serve as pedestals at the time of forming salient electrodes. The electrodes 7c are arranged three rows by three rows except a central portion in the short side direction of the product forming area 31.

On the other hand, between each chip mounting area 34 and each opening groove 9 (9a) is formed a groove 25 (see FIGS. 8 and 14) by removing the insulating film over a predetermined width. In this case, the insulating film is removed in the full thickness direction thereof, so that wiring lines 7 are exposed to the bottom of the groove 25. Positional and dimensional relations of the insulating film 4, opening grooves 9, electrodes 7b, grooves 25, and semiconductor chips 3 mounted are as explained above in connection with FIG. 8.

Figure 15:
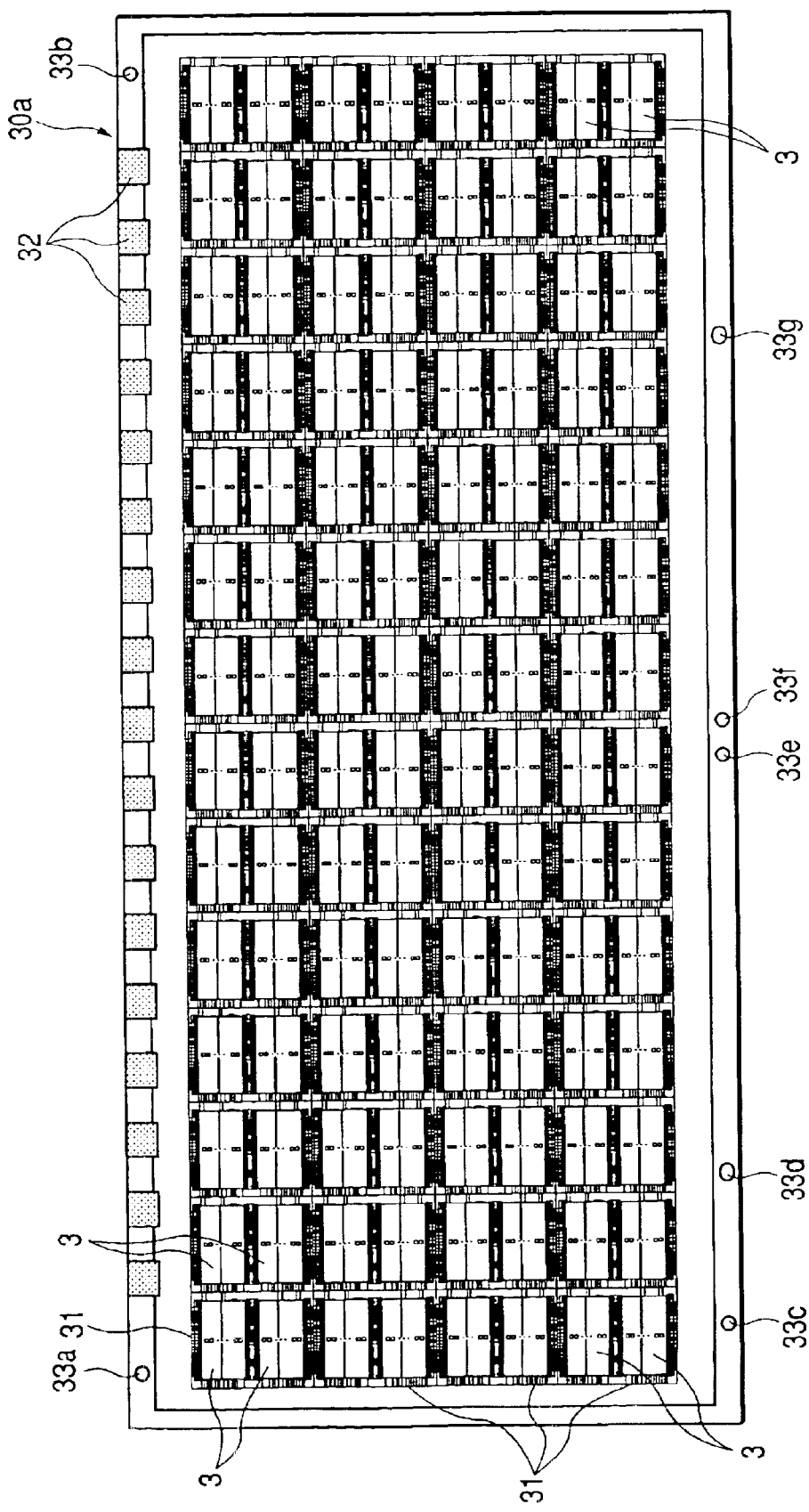
FIG. 15 is a plan view of the substrate with semiconductor chips mounted thereon in the semiconductor device manufacturing method according to the first embodiment.

Each semiconductor chip 3 is connected to each chip mounting area 34 through an adhesive 2 (chip bonding: S101). FIG. 15 is a plan view of the substrate 30a with semiconductor chips 3 mounted thereon. As the semiconductor chips 3 mounted on the substrate there are used, for example, 64MDRAM chips of the same type. The chips are quadrangular in shape.

Figure 16A:
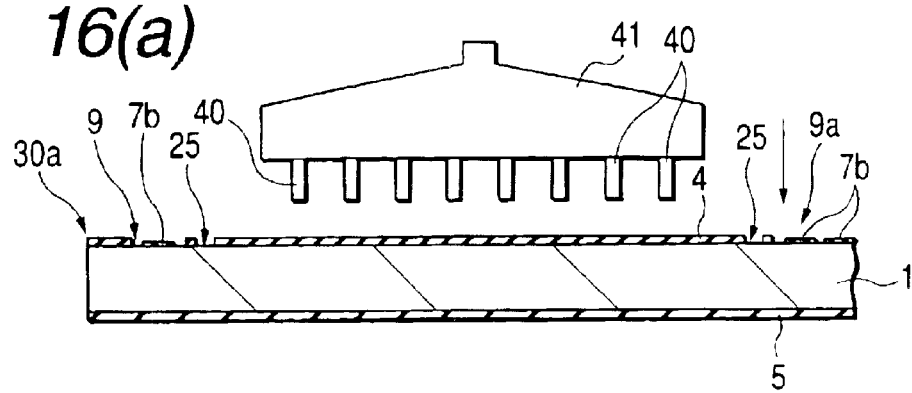
FIG. 16(*a*) is a schematic diagram showing in what state a semiconductor chip is fixed onto the substrate in the semiconductor device manufacturing method according to the first embodiment.
FIG. 16(d) is a schematic diagram showing in what state a semiconductor chip is fixed onto the substrate in the semiconductor device manufacturing method according to the first embodiment.
Figure 16B:
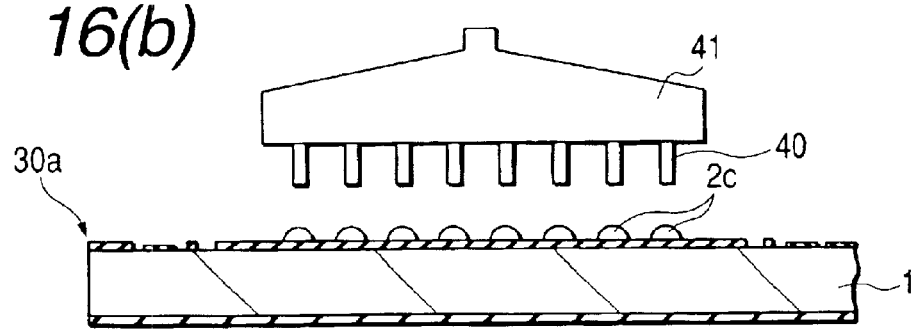

FIGS. 16(a) to 16(d) are schematic diagrams showing working steps in chip bonding. FIGS. 16(a) to 16(d) each illustrates a single chip mounting area in a single product forming area 31 on the substrate 30a. As shown in FIG. 16(a), a dispenser head 41 having plural nozzles 40 on a lower surface side thereof is brought down to a position above the substrate 30a and, as shown in FIG. 16(b), for example an epoxy resin-based pasty adhesive 2c is applied to the chip mounting area. The amount of application of the adhesive is controlled with a high accuracy.

Figure 16C:
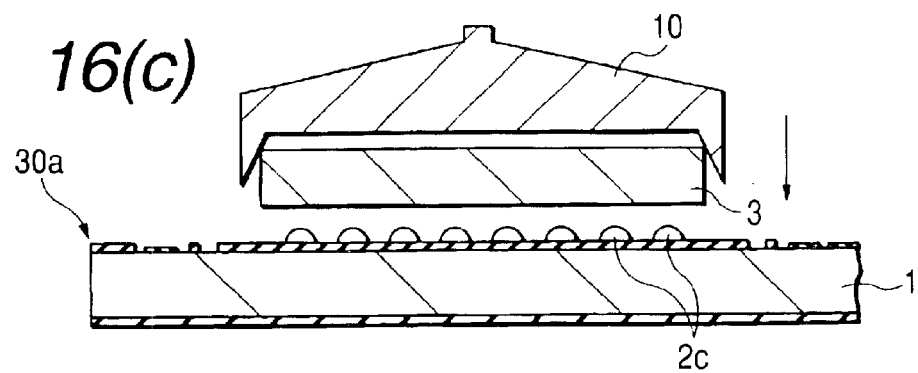
Figure 16D:
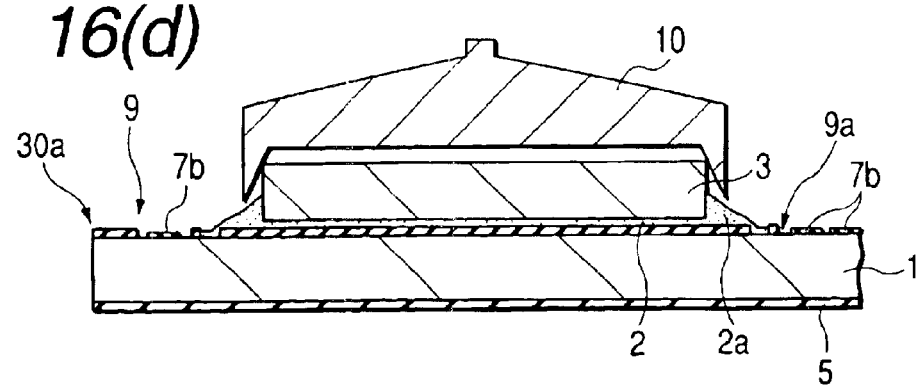

Next, as shown in FIG. 16(c), a bonding tool (collet; pyramidal collet) 10 which vacuum-chucks a semiconductor chip 3 on a lower surface side thereof is brought down to the chip mounting area and a predetermined pressure is applied, allowing the semiconductor chip 3 to be fixed onto the main surface of the substrate 30a by the pasty adhesive 2c as shown in FIG. 16(d). Thereafter, the pasty adhesive 2c is baked and cured to fix the semiconductor chip 3 onto the substrate 30a. The baking is performed at a temperature of 150° C. or so for example.

In this chip bonding step, the semiconductor chip 3 is pushed against the pasty adhesive 2c, but the adhesive 2c crawls up (swells) by virtue of its viscosity and at the same time flows out toward the exterior. However, since the total amount of the pasty adhesive 2c applied is controlled with a high accuracy and the grooves 25 are formed in a volume corresponding to the total amount, the protruding portion 2a of the adhesive stays within each groove 25 and does not reach the electrodes 7b beyond the grooves 25, as shown in FIG. 1. As a result, when wires are connected to the electrodes 7b in a later step, wire bonding can be done positively because the surfaces of the electrodes 7b are not stained by the adhesive 2, whereby it is possible to improve the product quality.

Besides, since the total amount of the pasty adhesive 2c is controlled highly accurately, the protruding portion 2a of the adhesive which swells on each end face of the chip crawls up to an intermediate position of the height (thickness) of the semiconductor chip 3, and the surface thereof becomes a slope having a gentle slant. With this slope, it is possible to prevent the formation of voids in a subsequent block molding step. More particularly, in block molding, resin which flows along the surface of the semiconductor chip 3 becomes difficult to involve air therein because end faces of the chip are covered with the protruding portion 2a of the adhesive and the surface of the protruding portion 2a is a slope, whereby it is possible to prevent the occurrence of voids. Consequently, it is possible to improve the product quality. In order to fill at least the space between the back surface of the semiconductor chip 3 and the main surface of the wiring substrate positively with sealing resin and in order to prevent the formation of voids in the sealing resin, it is desirable to control the amount of the adhesive so that a flow-out portion of the adhesive is formed over a 70% or larger area of each chip end face.

Further, if the height of the protruding portion 2a of the adhesive which swells on chip end faces is set at 70% or so of the height (thickness) of the semiconductor chip 3, the adhesive 2 will no longer adhere to the collet 10, thus causing no trouble based on adhesion of the adhesive. Consequently, not only the improvement of product quality but also the improvement of workability can be attained and it is possible to reduce the product cost.

In FIG. 1, the reference mark w located outside the distance m from a chip end face represents an allowance for dicing the block molding package and the substrate 30a, in other words, a width to be removed. In this first embodiment, the distance m is 0.8 mm.

Figure 17:
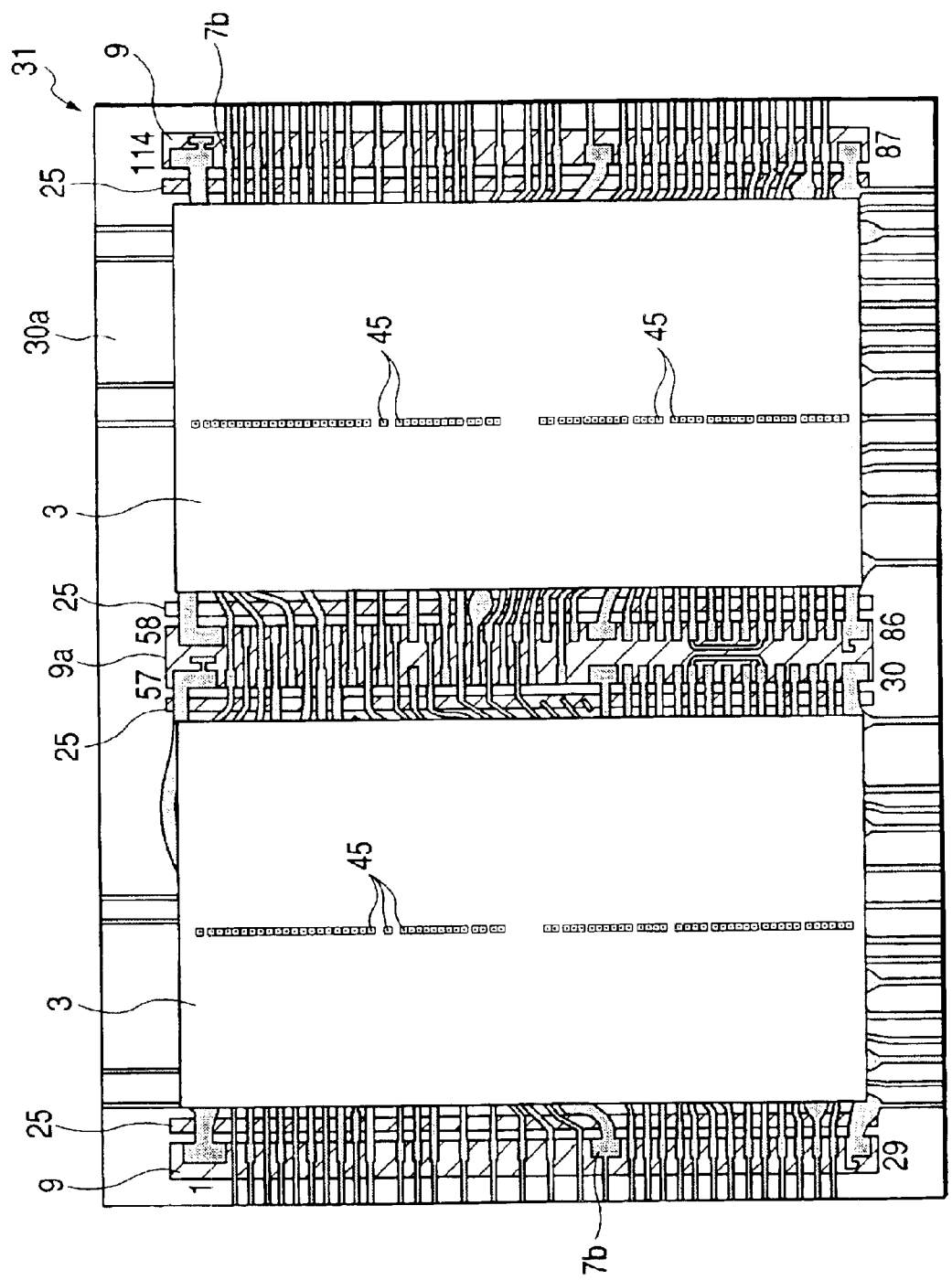
FIG. 17 is a schematic plan view showing a state in which two semiconductor chips are mounted side by side in a product forming area on the substrate.

FIG. 17 is a plan view of the product forming area 31 on the substrate 30a with semiconductor chips 3 fixed thereto. As shown in the same figure, each 64MDRAM chip has a structure in which electrodes 45 are arranged in a line along a center line extending in the long side direction of the chip. Insulating film is omitted in both FIG. 17 and FIG. 18 which follows.

Figure 18:
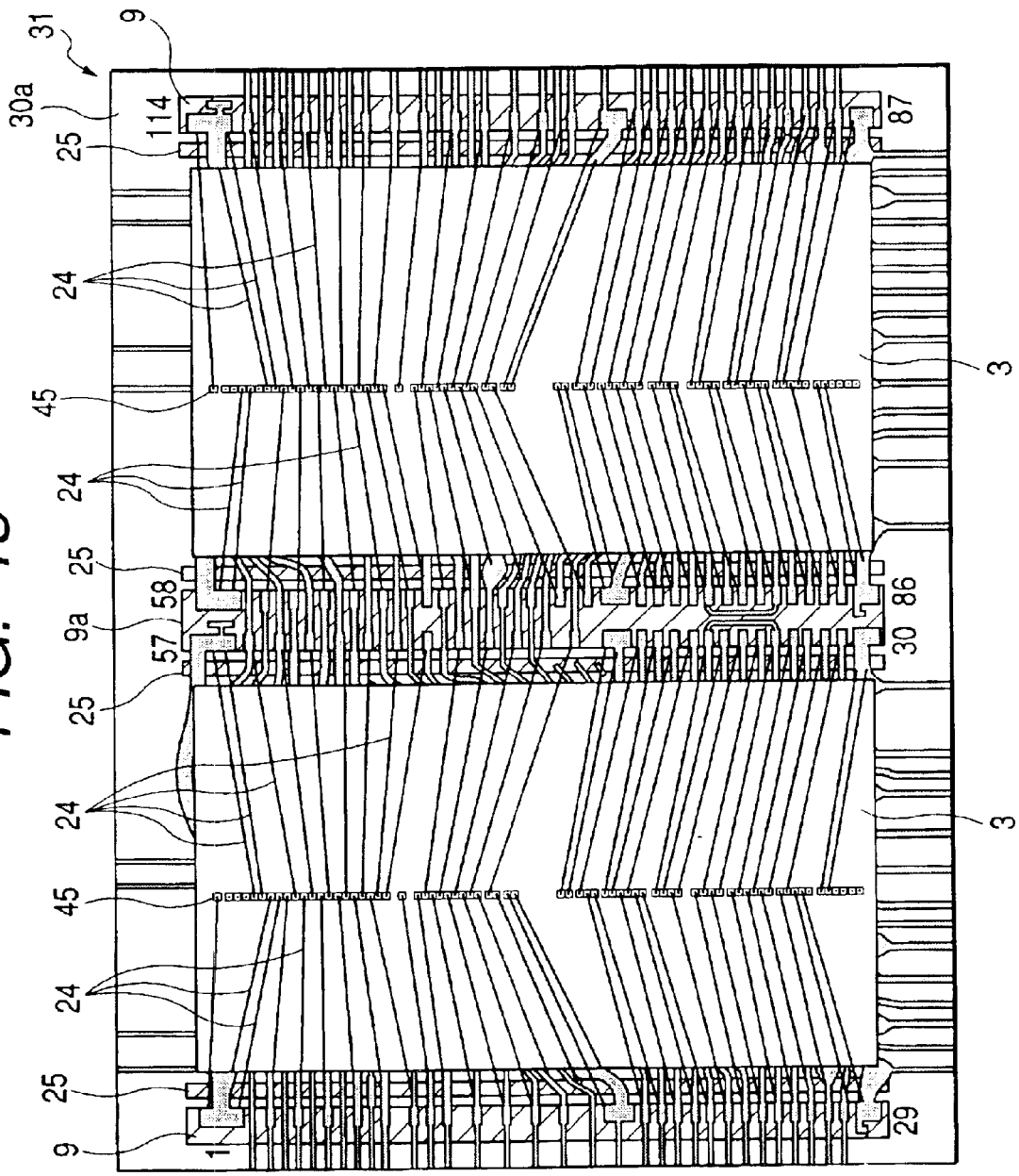
FIG. 18 is a schematic plan view showing a state in which electrodes on the semiconductor chips and electrodes on the substrate are connected together through wires in the semiconductor device manufacturing method according to the first embodiment.
Figure 19:
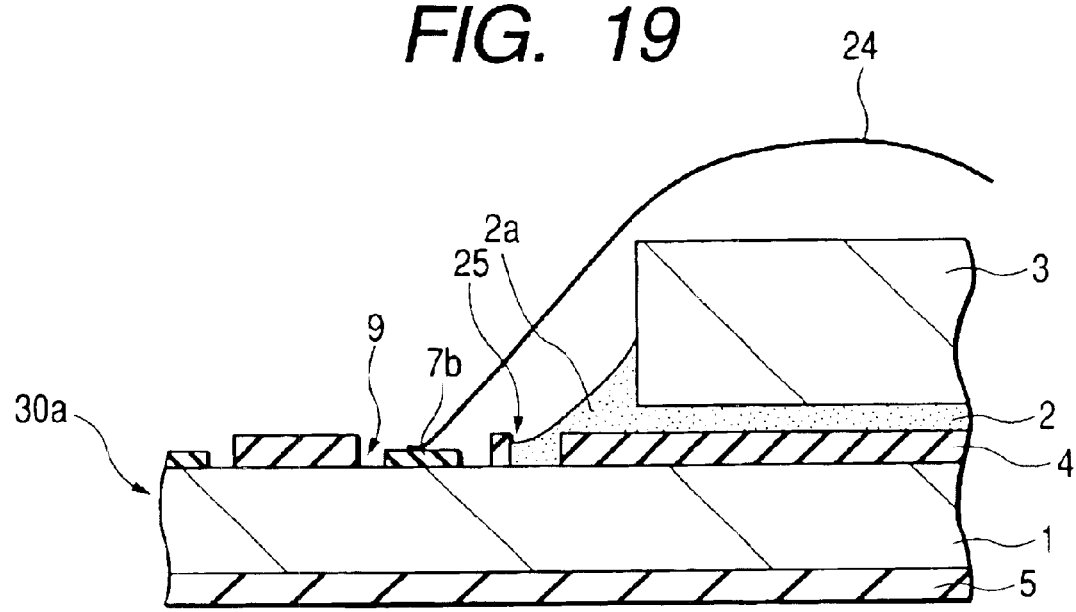
FIG. 19 is a schematic sectional view showing a state in which an electrode on a semiconductor chip and an electrode on the substrate are connected together through wire in the semiconductor device manufacturing method according to the first embodiment.

Next, as shown in FIG. 18, the electrodes 45 on each semiconductor chip 3 and the electrodes 7b arranged on both sides thereof are connected together electrically through conductive wires 24 (wire bonding: S102). For example, the wires 24 are gold wires. In this wire bonding step, the substrate 30a is heated to 125° C. or so for example to improve the bonding performance. FIG. 19 is an enlarged sectional view showing a part of the substrate 30a after wire bonding.

Figure 20:
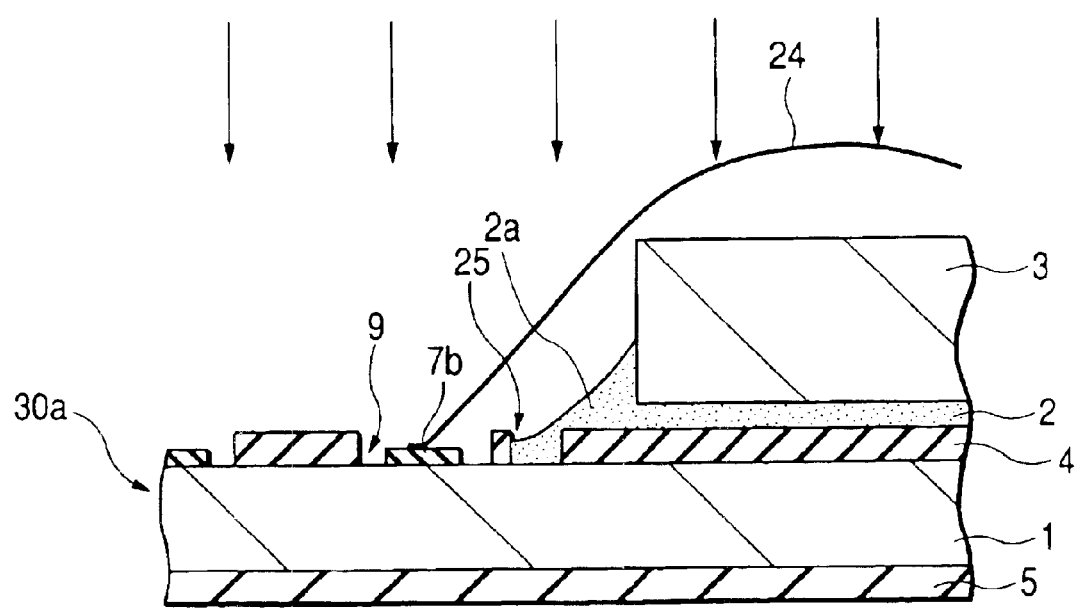
FIG. 20 is a schematic sectional view showing a state in which the surface of the semiconductor chip and that of the substrate are subjected to plasma cleaning in the semiconductor device manufacturing method according to the first embodiment.

Next, as shown in FIG. 20, plasma cleaning is performed throughout the whole of the main surface of the substrate 30a (S103) for the purpose of enhancing the adhesion between a block molding package and the main surface of the substrate in a subsequent block molding step. More specifically, plasma cleaning is performed as indicated with arrows to clean the main surface side of the substrate 30a. As a result, the main surface side of the substrate 30a, including the insulating film 4, the surfaces of the semiconductor chip and the adhesive 2, and the surfaces of the wires 24 are cleaned.

Figure 23:
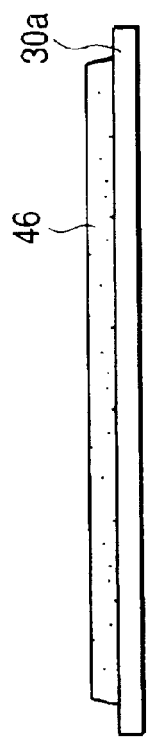
FIG. 23 is a side view thereof.

Next, block molding is performed by a transfer molding apparatus to form a single block molding package 46 on the main surface side of the substrate 30a (S104). As shown in FIGS. 21 to 23, the block molding package 46 is formed integrally with the substrate 30a except a peripheral edge portion of the substrate which is located outside the product forming areas 31. That is, 14 columns×4 rows of product forming areas 31 are covered with the block molding package 46 completely. The block molding package 46 has such a predetermined certain thickness as covers the semiconductor chips 3 and wires 24 completely and is formed using an insulating epoxy resin.

In this first embodiment, gate positions are set in a closely spaced relation to one another, whereby the sealing resin is filled uniformly throughout the whole of a cavity (mold space) in a molding die. Further, end faces of each semiconductor chip 3 are buried in a flow-out portion of the adhesive and the stepped portion between the main surface of the substrate 30a and the semiconductor chip 3 is buried with the adhesive. In this case, since the surface of the buried portion forms a gentle slope from the main surface side of the semiconductor chip 3 toward the main surface side of the substrate 30a, it does not disturb the flow of resin. Consequently, the flow of resin no longer involves air therein not only at a front end face of the semiconductor chip 3 but also at rear and both-side end faces of the chip, whereby the formation of voids can be prevented.

Figure 24:
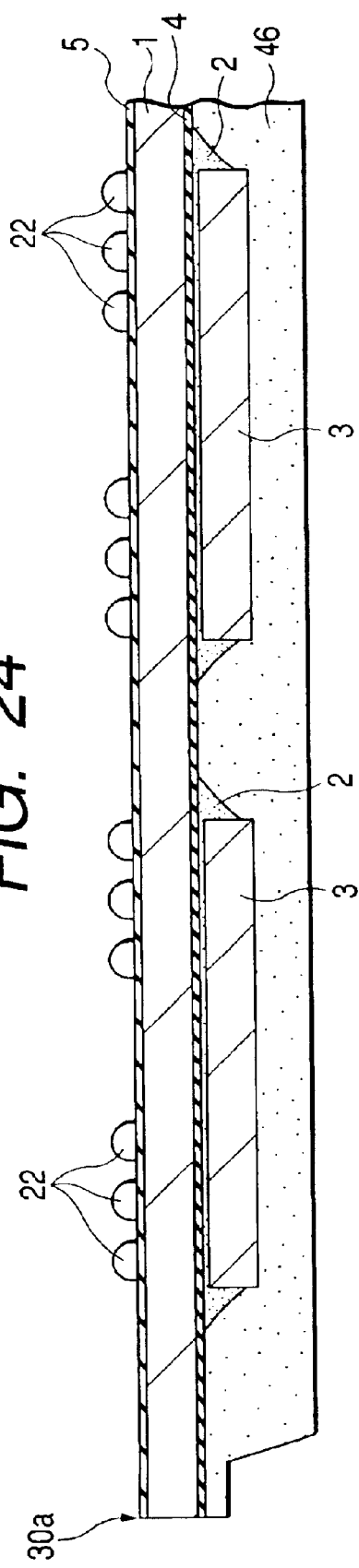
FIG. 24 is a sectional view of the substrate with solder bump electrodes formed thereon in the semiconductor device manufacturing method according to the first embodiment.

Next, as shown in FIG. 24, salient electrodes 22 are formed, for example by a ball supply method, on the surfaces of electrodes 7c (not shown, see FIG. 7) which are arranged on the back surface of the substrate 30a. For example, solder bump electrodes are formed by the supply of solder balls (S105).

Then, the substrate 30a with the block molding package 46 formed thereon is subjected to washing (S106).

Figure 25:
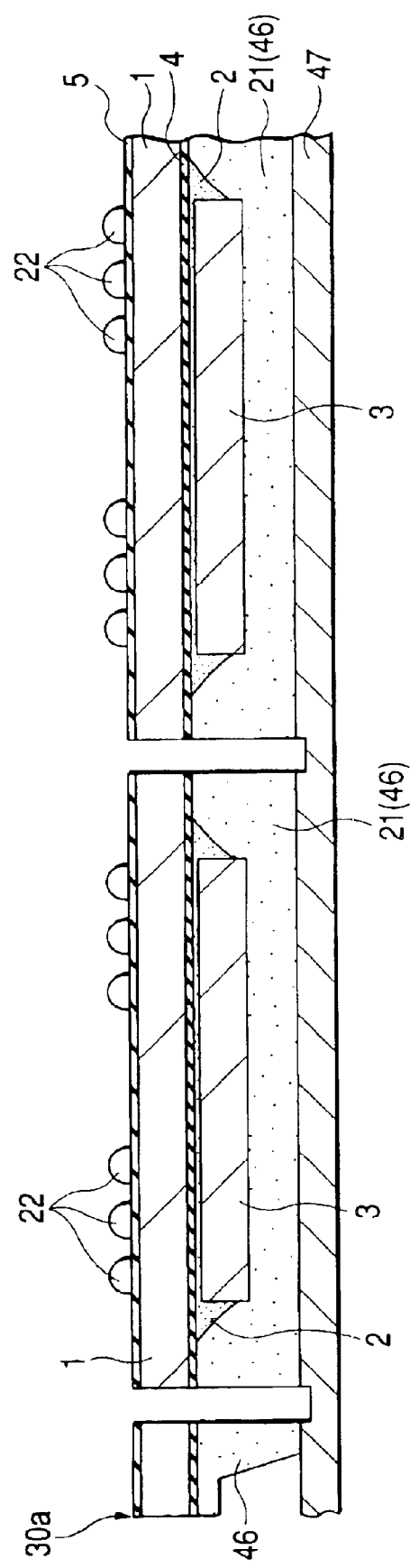
FIG. 25 is a schematic sectional view showing a state in which the substrate with its block molding package side affixed to a dicing sheet has been divided together with the block molding package in the semiconductor device manufacturing method according to the first embodiment.

Next, as shown in FIG. 25, the substrate 30a is bonded and fixed to a dicing sheet 47 in a state in which the block molding package 46 formed by block molding confronts the dicing sheet. Thereafter, the block molding package 46 and the substrate 30a are cut and divided for each product forming area 31 by means of a dicing device (not shown) (S107). As a result of this dicing work, the substrate 30a becomes the substrate 1 and the block molding package 46 becomes an individual package, or seal member 21. Subsequently, by separating the dicing sheet 47 and the block molding package (seal members 21, etc.) from each other, there can be manufactured a large number of such semiconductor devices 20 as shown in FIGS. 2 to 7. Side faces, or peripheral faces, of each semiconductor device 20 are cut faces by dicing, which faces are nearly perpendicular to the main surface of the wiring substrate 1.

According to this first embodiment there are obtained the following effects.

(1) In the semiconductor device 20 adopting the block molding method wherein the seal member 21 and the wiring substrate 1 have side faces cut by dicing, a groove 25, which is formed by partially removing the insulating film 4, is provided between the semiconductor chip fixed to the wiring substrate 1 through the adhesive 2 and the electrodes 7b on the main surface of the wiring substrate, so that the flow-out portion 2a of the adhesive stays within the groove 25 and does not reach the electrodes 7b on the main surface of the wiring substrate and hence the connection of wires 24 connected to the electrodes 7b becomes more reliable. Consequently, not only the improvement in quality of the semiconductor device 20 can be attained but also the improvement in production yield of the semiconductor device 20 and the reduction of its manufacturing cost can be achieved.

(2) By forming the groove 25 and allowing the protruding portion 2a of the adhesive to stay within the groove 25 it is possible to shorten the distance between an inner wall of the opening groove and the semiconductor chip 3 in comparison with the prior art and hence possible to attain the reduction in size of the semiconductor device 20 also in the semiconductor device manufacturing method which adopts the block molding method.

(3) By ensuring a predetermined distance between an outer wall of the opening groove 9 and an end of the wiring substrate it is possible to ensure a required bonding force between the wiring substrate 1 and the seal member 21 and hence possible to prevent the deterioration of moisture resistance caused by peeling between the wiring substrate 1 and the seal member 21. That is, by adopting the construction which uses the groove 25 to prevent flowing-out of the adhesive it is possible to shorten the distance between a chip end and each electrode 7b on the substrate and, even within the limited size of each semiconductor device formed by the block molding method, it is possible to ensure a width of 200 $\mu$m or more for example of the insulating film (solder resist) sufficient to prevent peeling of the substrate which insulating film covers the wiring lines along end portions of the substrate. Moreover, the distance from end faces of the wiring substrate 1 and seal member 21 to an end face of the semiconductor chip 3 becomes as small as 0.8 mm or so and thus it is possible to attain the reduction in size of the semiconductor device 20.

(4) Each groove 25 can be formed in the insulating film 4 simultaneously with the step of forming each opening groove 9 in the insulating film (solder resist film) 4 for the exposure of electrodes on the substrate, which insulating film is disposed between the back surface of the chip and the wiring lines 7 on the substrate for the purpose of insulation between the back surface of the chip and the wiring lines on the substrate, and thus the groove 25 can be formed in a simpler step in comparison with the case of partially overlapping the insulating film 4 to form a dam-like structure.

(5) Since the insulating films (solder resists) 4 and 5 are formed on both surfaces (main surface and the back surface) of the substrate 1, internal stresses if any in the solder resists 4 and 5 are offset each other at both surfaces of the substrate 1, so that it is possible to prevent warping of the substrate 1 and there can be obtained a semiconductor device 20 which is superior in quality.

(6) By allowing the protruding portion of the adhesive 2 to stay within the groove 25 it is possible to prevent the adhesive from crawling up more than necessary onto side faces of the chip. Consequently, when the semiconductor chip is to be held by the pyramidal collet 10 in chip bonding, the collet 10 becomes difficult to be stained by the adhesive, so that it is possible to prevent a lowering of yield in chip bonding caused by stain of the collet 10 and hence possible to prevent an increase in the manufacturing cost of the semiconductor device 20 caused by a lowering of yield.

(7) The insulating film 4 extending between the semiconductor chip 3 and the wiring substrate 1 can prevent shorting of plural wiring lines 7.

(8) The adhesive 2 for bonding the semiconductor chip 3 to the wiring substrate 1 also covers end faces of the chip; for example, it covers 70% or so of chip end faces, so air becomes difficult to be involved in chip end faces in the flow of resin at the time of sealing and hence the formation of voids becomes difficult. Consequently, the semiconductor device 20 can be manufactured in good quality and less expensively.

(9) In the semiconductor device manufacturing method there is used the substrate (wiring substrate) 30a having plural product forming areas 31 arranged longitudinally and transversely in regular order and semiconductor chips 3 are fixed respectively to the product forming areas 31 through the adhesive 2. In this chip fixing step, a portion of the adhesive which has protruded (the protruding portion 2a of the adhesive) gets into each groove 25 and does not flow out beyond the groove 25, so there is no fear that the electrodes 7b on the main surface of the wiring substrate may be contaminated by the adhesive 2. Accordingly, the wires 24 can be fixed positively to the electrodes 7b on the main surface of the substrate and it is possible to manufacture the semiconductor device 20 in high reliability of wire bonding and in high yield and further possible to attain the reduction in cost of the semiconductor device 20.

Second Embodiment

Figure 26:
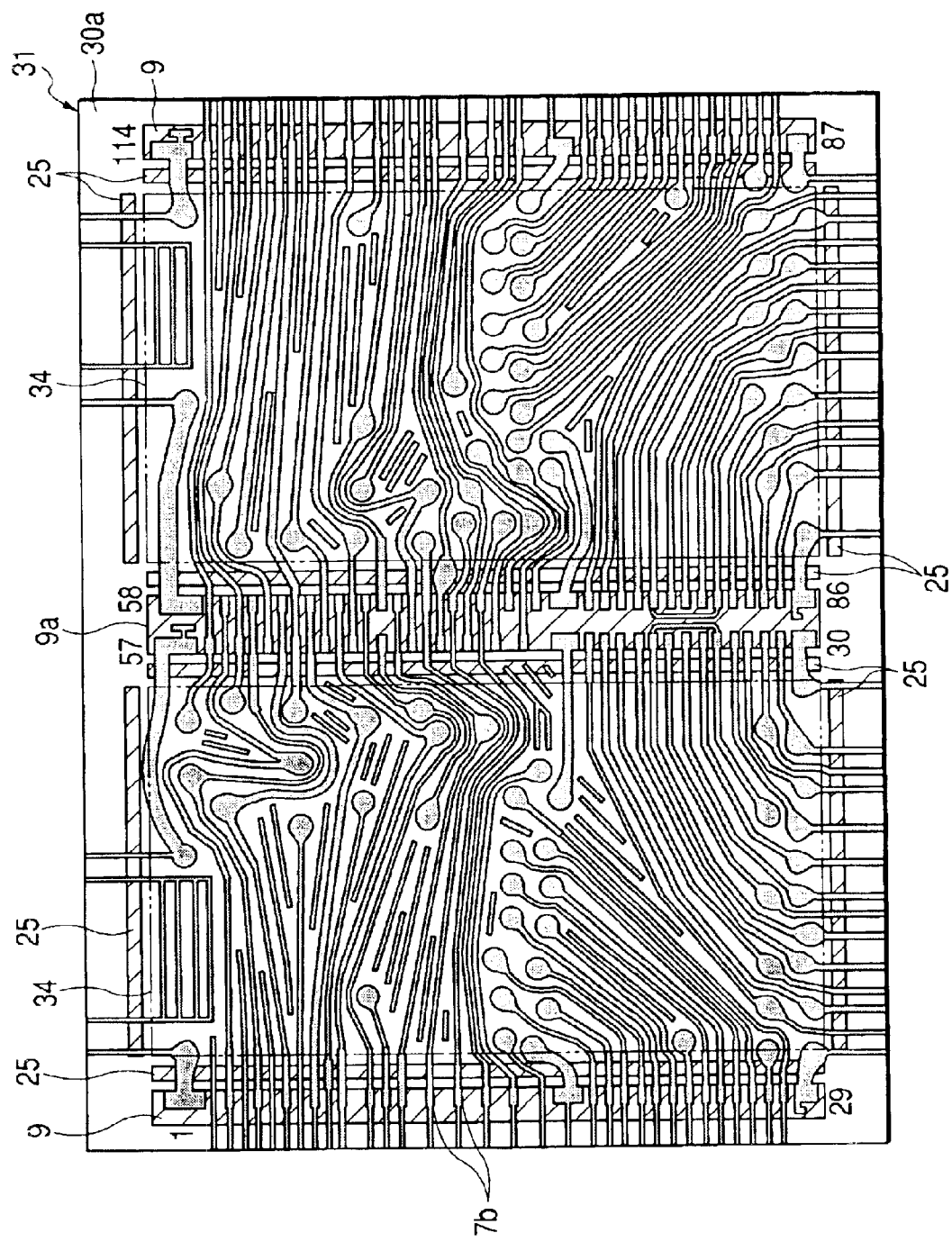
FIG. 26 is a plan view showing a part of a substrate used in a method of manufacturing a semiconductor device according to another embodiment (second embodiment) of the present invention.
Figure 27:
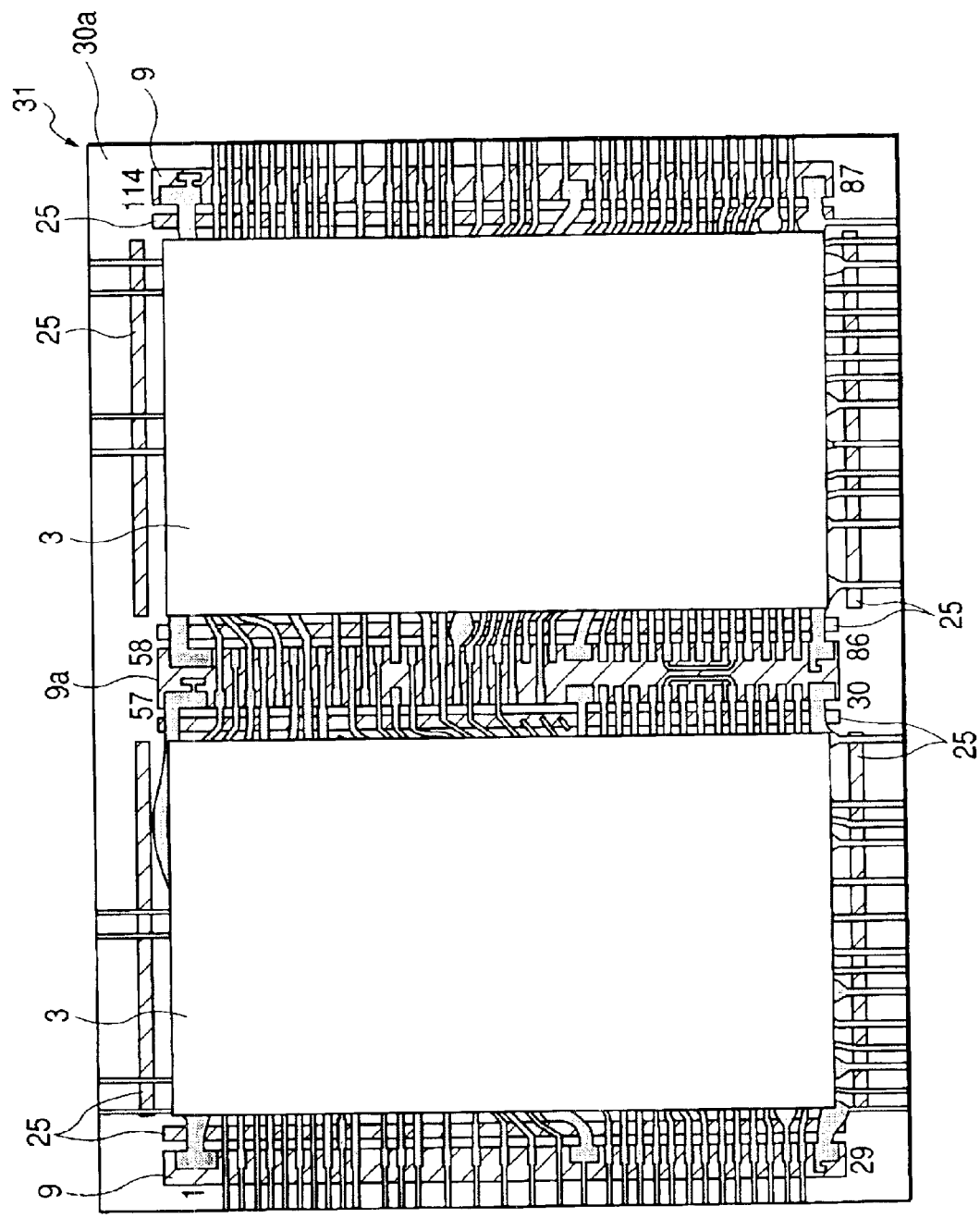
FIG. 27 is a plan view showing a part of the substrate with semiconductor chips mounted thereon in the semiconductor device manufacturing method according to the second embodiment.

FIGS. 26 and 27 are concerned with a method of manufacturing a semiconductor device according to another embodiment (second embodiment) of the present invention, of which FIG. 26 is a plan view showing a main surface of a product forming area on a substrate which is used in the manufacture of the semiconductor device and FIG. 27 is a plan view showing the main surface of the product forming area with semiconductor chips mounted thereon.

In the semiconductor device manufacturing method according to this second embodiment, grooves 25 are also formed along long sides of each product forming area 31. To be more specific, in the first embodiment grooves 25 are formed outside and along the long sides of each chip mounting area 34, while in this second embodiment grooves 25 are also formed outside and along the short sides of each chip mounting area. The grooves 25 formed on both long and short sides are not in direct contact with each other.

Each semiconductor chip 3 is quadrangular (see FIG. 27) and the chip mounting area 34 with the semiconductor chip 3 fixed thereto is also in a quadrangular shape similar to the semiconductor chip 3. Grooves 25 are formed along the four sides of the semiconductor chip 3 (chip mounting area 34). At each corner portion of the aforesaid quadrangular shape the insulating film located in the interior of each groove 25 and the insulating film located in the exterior of the groove are connected with each other.

Thus, in this second embodiment, a groove 25 is formed also between a chip end and a substrate end in each of the portions where the electrodes 7b are not present, whereby it is possible to prevent the adhesive 2 from being exposed to diced faces. Further, it is possible to prevent the occurrence of peeling and defect caused by exposure of an interface between the adhesive 2 and the seal member 21 which are bonded together with a bonding force lower than that between the insulating film 4 and the seal member 21 and also possible to prevent the entry of water into the seal member (package) caused by exposure of the adhesive 2 which is easier to absorb water than the seal member 21.

In the case where the insulating films (solder resists) 4 and 5 have internal stresses, the solder resists 4 and 5 are formed on both surfaces of the substrate 1, allowing the internal stresses to be offset by both surfaces of the substrate and thereby preventing the occurrence of warp of the substrate. In this case, in order to prevent the stress balance from being lost between the surface and the back surface of the substrate, it is preferable that the solder resist 4 formed on the main surface of the substrate be formed in a shape able to hold its internal stress. From such a standpoint, also in the case where grooves 25 are formed in the insulating film along the four sides of a chip which is quadrangular for example, it is preferable to adopt a shape in which inside and outside insulating films with respect to each groove 25 be connected with each other at each corner portion of the chip.

Third Embodiment

Figure 28:
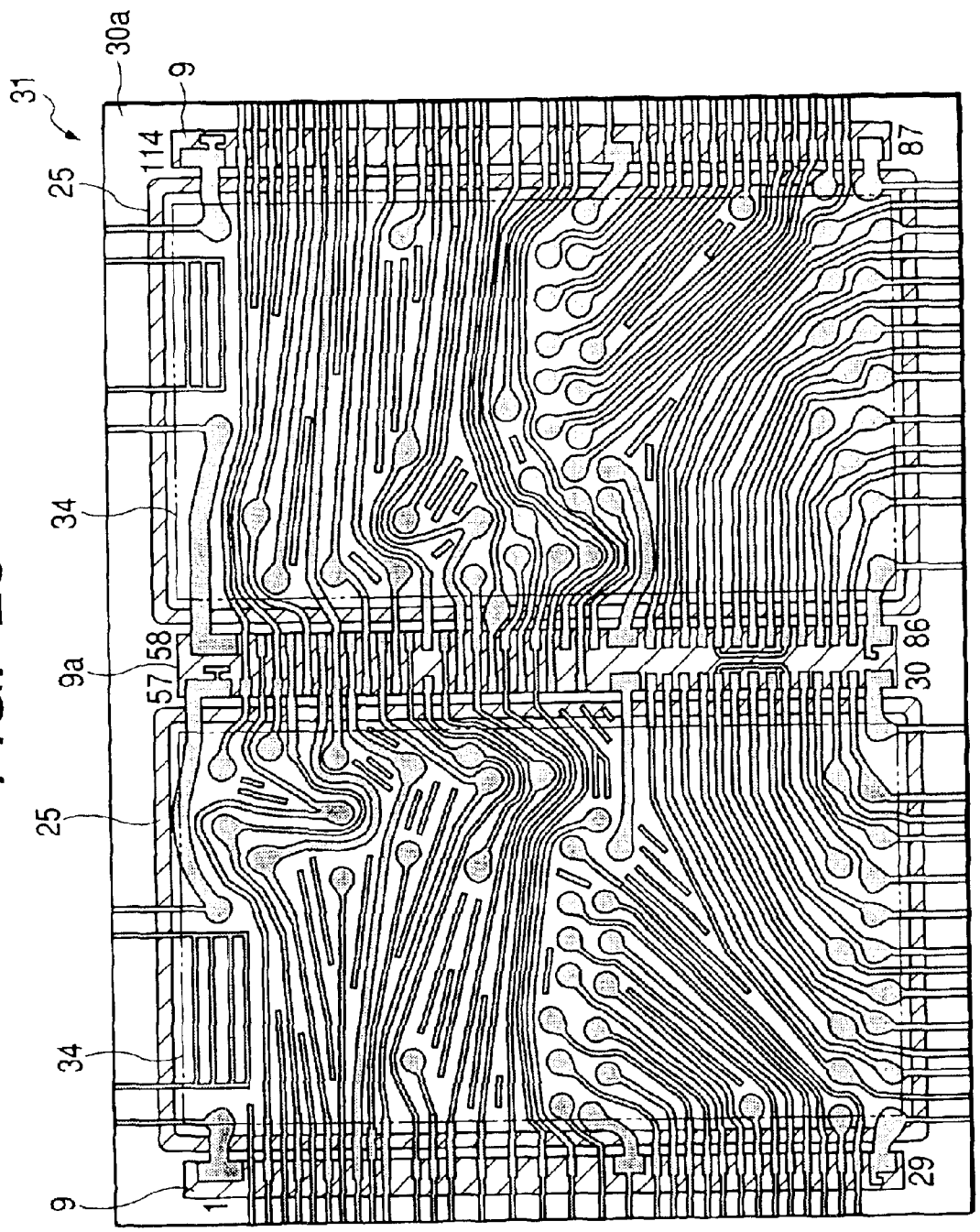
FIG. 28 is a plan view showing a part of a substrate used in a method of manufacturing a semiconductor device according to a further embodiment (third embodiment) of the present invention.
Figure 29:
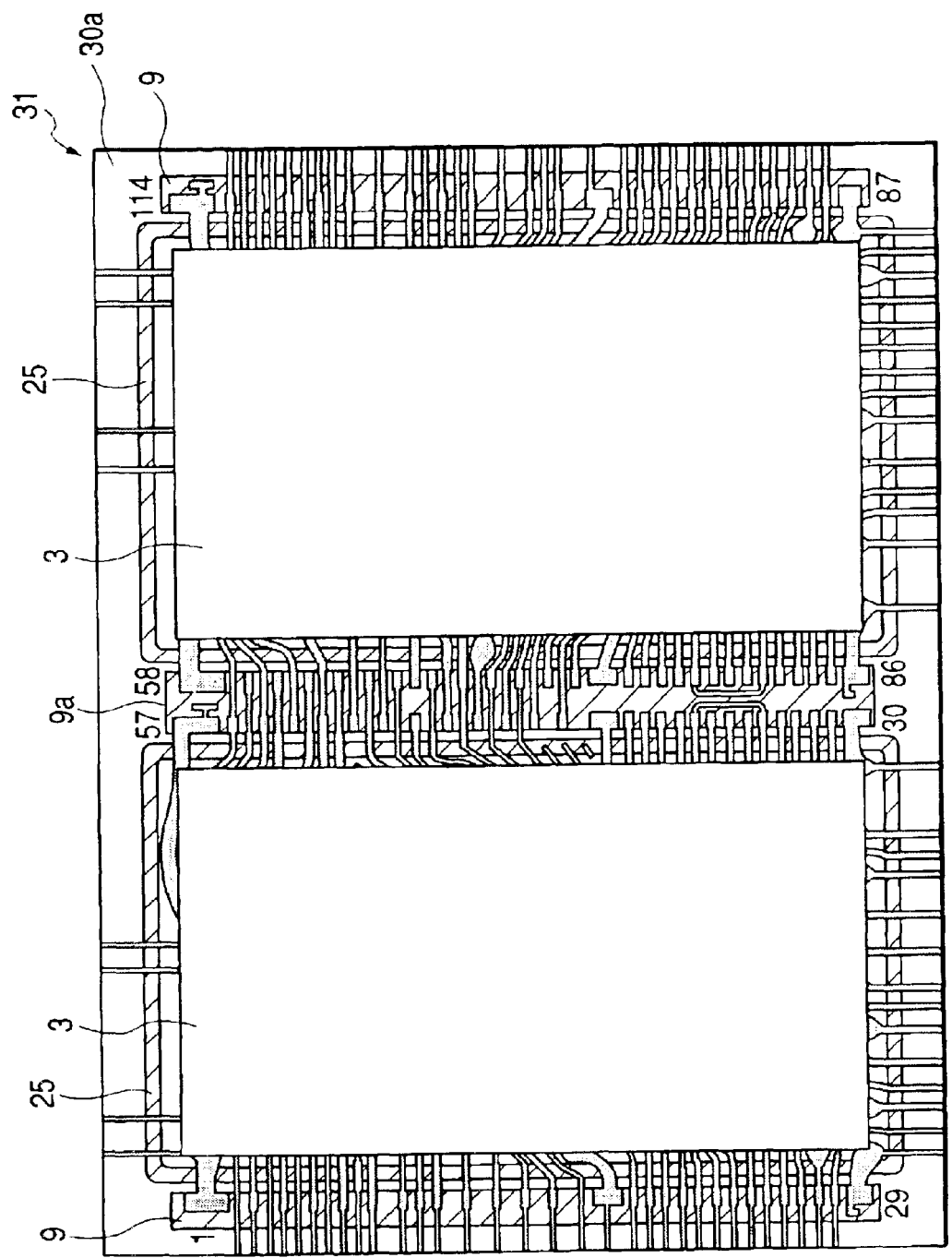
FIG. 29 is a plan view showing a part of the substrate with semiconductor chips mounted thereon in the semiconductor device manufacturing method according to the third embodiment.

FIGS. 28 and 29 are concerned with a method of manufacturing a semiconductor device according to a further embodiment (third embodiment) of the present invention, of which FIG. 28 is a plan view showing a main surface of a product forming area on a substrate which is used in the manufacture of the semiconductor device and FIG. 29 is a plan view of the main surface of the product forming area with semiconductor chips mounted thereon.

In this third embodiment, a groove 25 is formed so as to surround the whole periphery of each chip mounting area 34 in the pattern of the product forming area 31 described in the first embodiment. In this third embodiment, a pasty material gets into the groove formed around the whole periphery of the chip concerned at the time of chip bonding. This brings about an effect of controlling the crawling-up of the pasty material onto the chip and controlling the protrusion of the pasty material from side faces of the chip.

Fourth Embodiment

Figure 30:
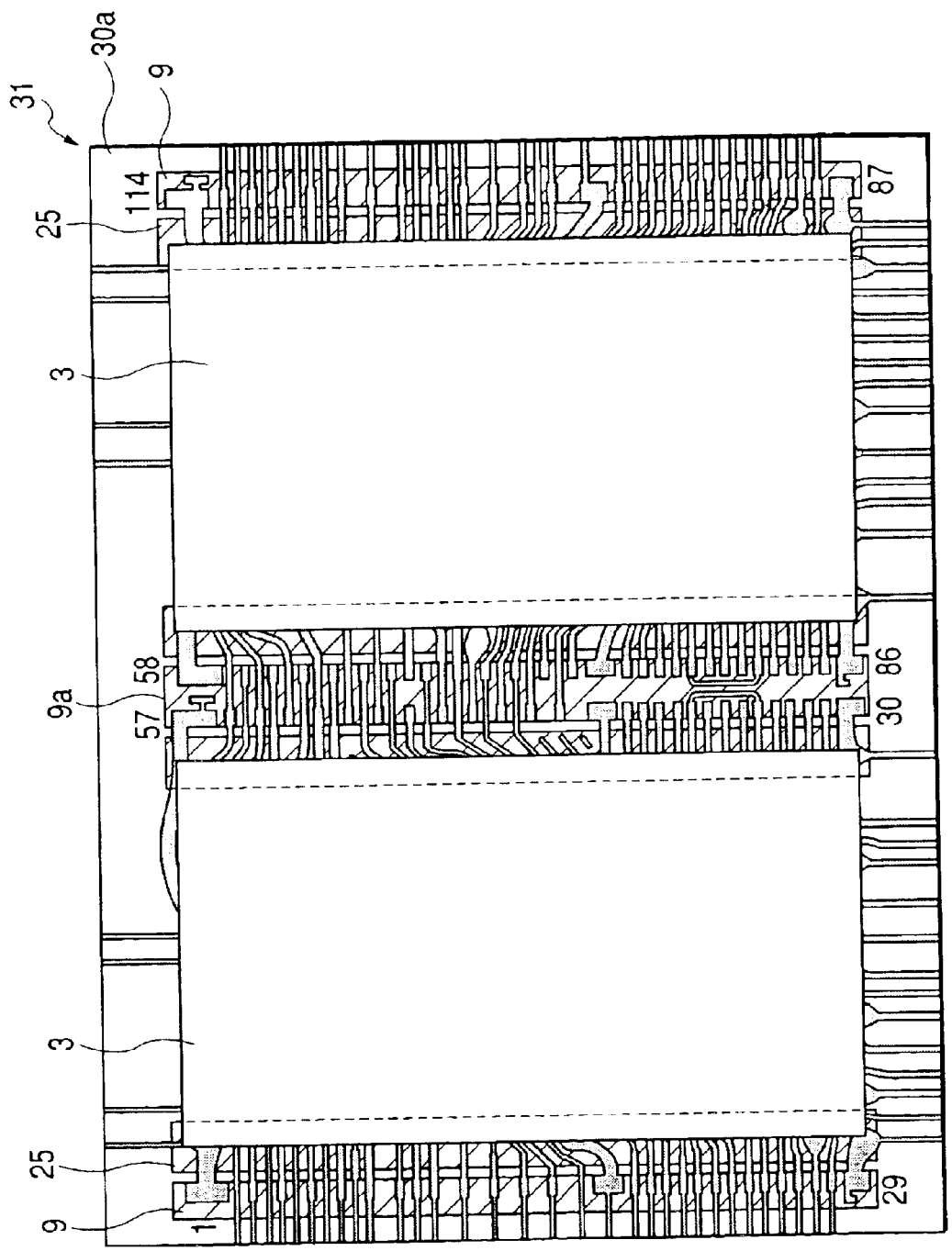
FIG. 30 is a plan view showing a part of a substrate with semiconductor chips mounted thereon in a method of manufacturing a semiconductor device according to a further embodiment (fourth embodiment) of the present invention.
Figure 31:
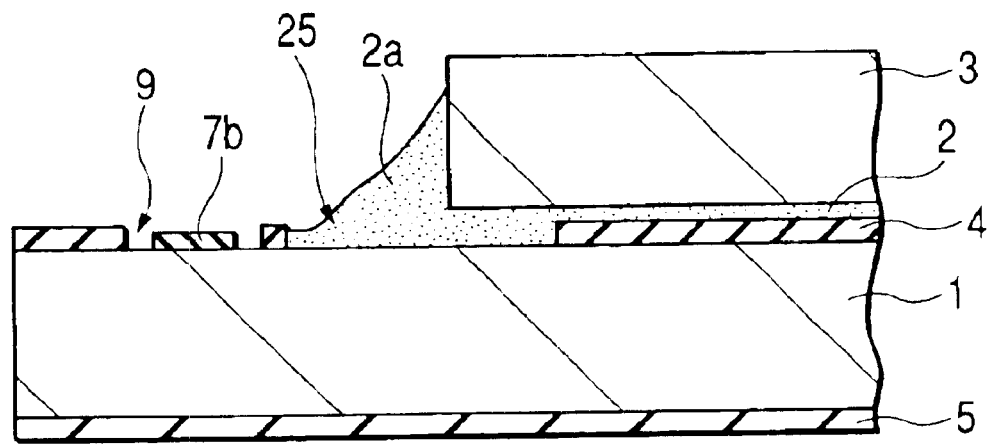
FIG. 31 is a partial enlarged sectional view of the substrate, showing a relation between a semiconductor chip and a groove in the semiconductor device manufacturing method according to the fourth embodiment.
Figure 32:
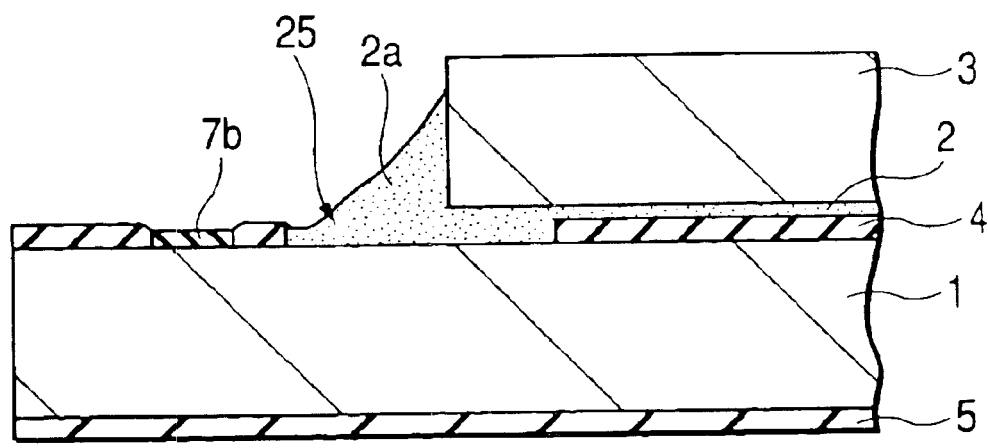
FIG. 32 is a partial enlarged sectional view of another substrate, showing a relation between a semiconductor chip and a groove in the semiconductor device manufacturing method according to the fourth embodiment.

FIGS. 30 to 32 are concerned with a method of manufacturing a semiconductor device according to a further embodiment (fourth embodiment) of the present invention, of which FIG. 30 is a plan view showing a main surface of a product forming area with semiconductor chips mounted thereon, FIG. 31 is a partial enlarged sectional view showing a relation between a semiconductor chip and a groove, and FIG. 32 is a partial enlarged sectional view of another substrate, showing a relation between a semiconductor chip and a groove.

As shown in FIGS. 30 and 31, a product forming area 31 in this fourth embodiment is the same as the product forming area 31 described in the first embodiment except that grooves 25 formed along the long sides of the semiconductor chip 3 are extended up to below the chip.

Such a structure makes it possible to enlarge the space for the stay of the adhesive 2 therein. Where the space for the adhesive 2 is to be unchanged, each groove 25 for the stay of the adhesive 2 therein can be shifted to the semiconductor chip 3 side. By so doing, the width of the insulating film 4 located between the groove 25 and the opening groove 9 becomes larger, the area of contact between the insulating film and the seal member 21 increases, the bonding force between the seal member 21 and the wiring substrate 1 increases as well, and the semiconductor device 20 becomes high in moisture resistance.

FIG. 32 shows a structure in which the wire bonding faces of the electrodes 7b are exposed without forming the opening groove 9, and the insulating film 4 also covers peripheral edges of the electrodes 7b. According to this structure, the area of contact between the insulating film and the seal member 21 increases, the bonding force between the seal member 21 and the wiring substrate 1 increases as well, and the semiconductor device 20 becomes high in moisture resistance.

Fifth Embodiment

Figure 33:
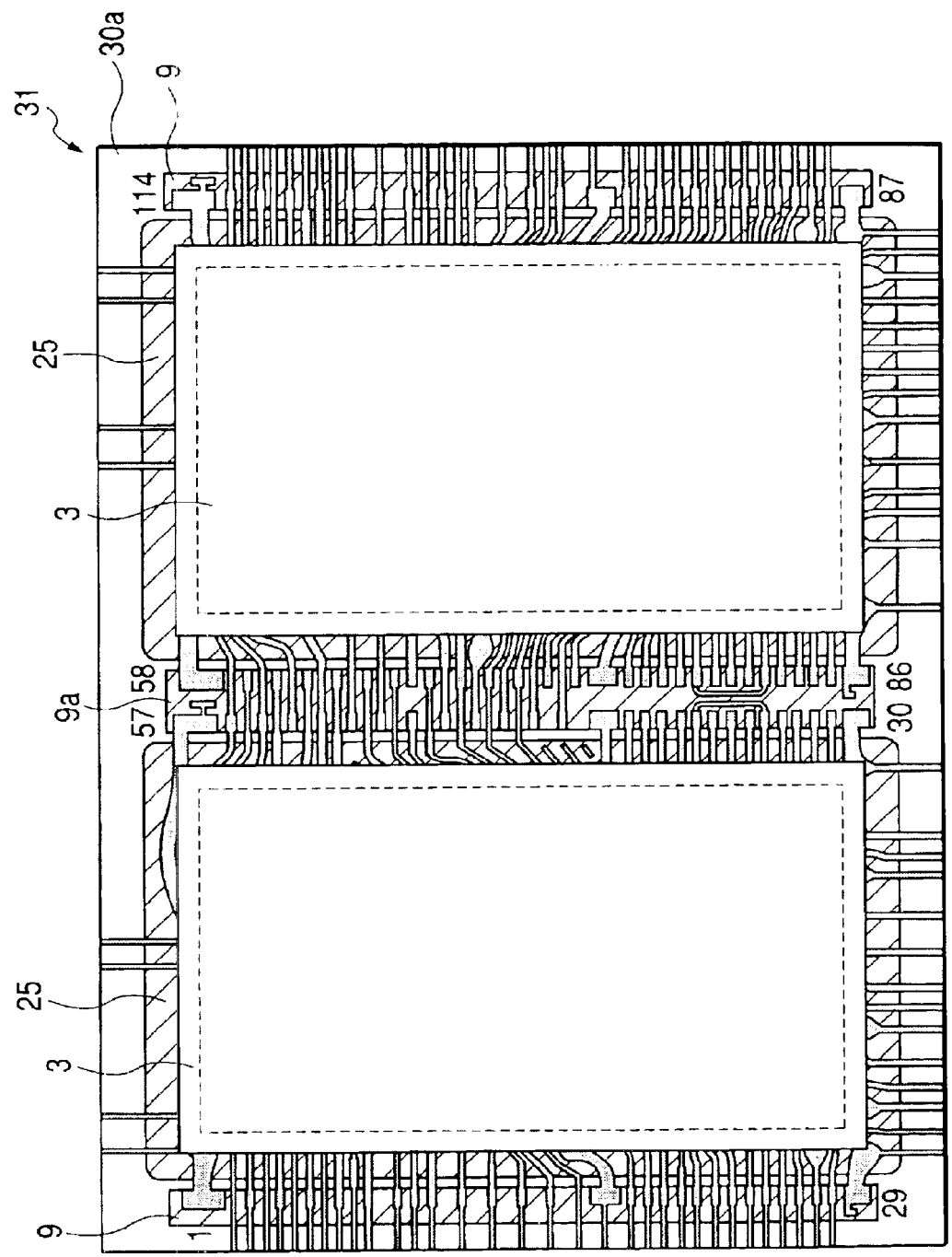
FIG. 33 is a plan view showing a part of a substrate with semiconductor chips mounted thereon in a method of manufacturing a semiconductor device according to a further embodiment (fifth embodiment) of the present invention.

FIG. 33 is a plan view showing a part of a substrate with semiconductor chips mounted thereon which is used in a method of manufacturing a semiconductor device according to a further embodiment (fifth embodiment) of the present invention.

In this fifth embodiment, a groove 25 is formed so as to surround the whole periphery of each chip mounting area 34 in the pattern of the product forming area 31 described in the first embodiment and the groove 25 is extended up to below the semiconductor chip 3 mounted in the chip mounting area 34 as in the previous fourth embodiment. According to this fifth embodiment, not only the same effects as in the fourth embodiment can be obtained, but also, since the groove 25 is formed so as to surround the whole periphery of the chip mounting area 34, it is possible to prevent a pasty material from crawling up onto an upper surface of the chip and also prevent it from protruding from side faces of the chip.

Although the present invention has been described above concretely by way of embodiments thereof, it goes without saying that the present invention is not limited to the above embodiments, but that various changes may be made within the scope not departing from the gist of the invention. For example, although in the above embodiments a glass fabric-based epoxy resin substrate is used as the substrate 30a, the present invention is effective also in case of using as the substrate 30a a substrate formed of BT resin.

It is preferable that the groove 25 formed in the insulating film have a sufficient width to prevent the adhesive 2 from overflowing to the exterior. But even in the event the adhesive 2 should overflow to the insulating film 4 located outside the groove 25, such an overflow is allowable if it is to such an extent as does not reach the connection between electrodes and bonding wires.

Figure 37:
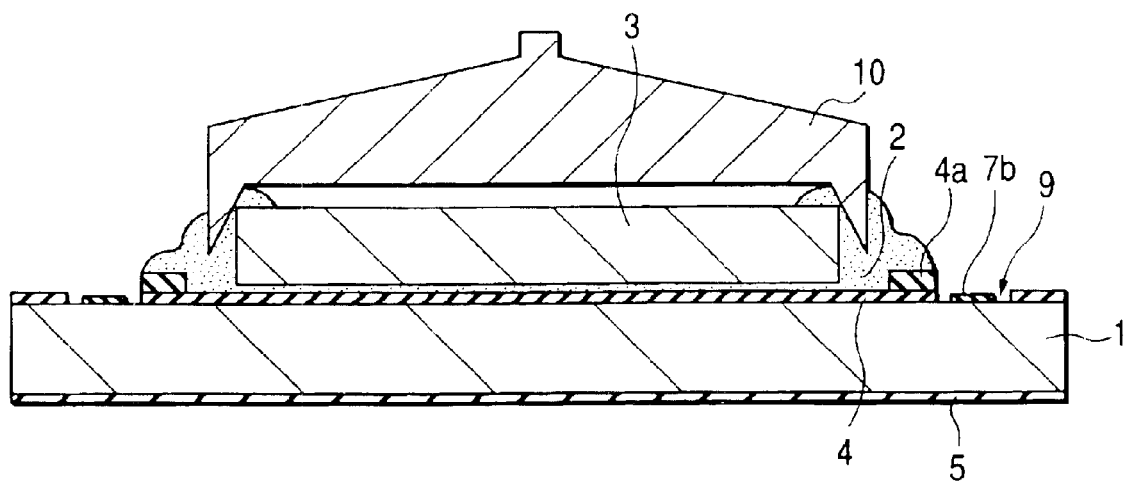
FIG. 37 is a schematic diagram showing a state in which an adhesive comes into contact with a collet at the time of mounting a semiconductor chip in the conventional semiconductor device manufacturing method.

In such a case, since the height of the insulating film 4 located between the groove 25 and the electrodes 7b on the wiring substrate is equal to or lower than the height of the insulating film 4 located in the chip mounting area, the bonding tool is less likely to be contaminated by the adhesive 2 than in FIG. 37 in which the adhesive 2 overflows onto an insulating film 4a formed in the shape of a dam.

The present invention is applicable to any semiconductor device manufacturing technique which adopts at least the block molding method.

The following is a brief description of effects obtained by typical inventions disclosed herein.

(1) In a semiconductor device manufacturing method which adopts block molding and in which semiconductor chips are fixed to a wiring substrate through an adhesive, it is possible to provide a suitable method for preventing the outflow of the adhesive.

(2) Since the block molding method is adopted and the occurrence of a defect caused by protrusion of the adhesive can be prevented, it is possible to reduce the semiconductor device manufacturing cost.

What is claimed is:

1. A semiconductor device comprising:

a wiring substrate including a main surface, an insulating film formed on the main surface, and a plurality of electrodes formed on the main surface;

a semiconductor chip having a main surface and a back surface, further having a plurality of semiconductor elements and a plurality of electrodes both formed on the main surface, the semiconductor chip being fixed to the wiring substrate through an adhesive in a state in which the back surface thereof confronts the main surface of the wiring substrate;

conductive wires for connecting the electrodes on the main surface of the wiring substrate with the electrodes on the semiconductor chip; and a seal member which covers the semiconductor chip, the main surface of the wiring substrate and the electrodes, wherein the electrodes on the wiring substrate are arranged around the semiconductor chip, wherein the insulating film has a first portion formed between the semiconductor chip and the main surface of the wiring substrate, a second portion formed between of outer periphery of the semiconductor chip and the electrodes on the wiring substrate, and a groove formed between the first portion and the second portion, wherein the seal member and the wiring substrate have side faces cut by dicing, and wherein the adhesive covers a part of end faces of the semiconductor chip and is not provided on the main surface of the semiconductor chip and wherein the adhesive is provided in the interior of the groove and is not provided in the portion where the electrodes on the wiring substrate and the conductive wires are connected together.

2. A semiconductor device according to claim 1, wherein the adhesive is not provided on the second portion of the insulating film.

3. A semiconductor device according to claim 2, wherein the groove has such a sectional area as a protruding portion of the adhesive does not get over the groove.

4. A semiconductor device according to claim 1, wherein the electrodes on the main surface of the wiring substrate are each covered with the insulating film from a peripheral edge thereof to a side face portion thereof.

5. A semiconductor device according to claim 1, wherein the electrodes on the main surface of the wiring substrate are arranged along a center of an opening groove formed by partially removing the insulating film.

6. A semiconductor device according to claim 1, wherein the groove extends through the insulating film.

7. A semiconductor device according to claim 1, wherein the adhesive protrudes at a portion of 70% or more of the chip end faces.

8. A semiconductor device according to claim 1, wherein the groove extends up to below the semiconductor chip.

9. A semiconductor device according to claim 1, wherein a plurality of wiring lines are formed between the main surface of the wiring substrate and the back surface of the semiconductor chip, and the first portion of the insulating film is formed between the plural wiring lines and the back surface of the semiconductor chip.

10. A semiconductor device according to claim 1, wherein the adhesive is an insulating resin.

11. A semiconductor device according to claim 1, wherein the distance from end faces of the wiring substrate and the seal member to an end face of the semiconductor chip in not longer than 0.8 mm.

12. A semiconductor device according to claim 1, wherein a plurality of semiconductor chips are mounted on the main surface of the wiring substrate.

13. A semiconductor device according to claim 1, wherein a plurality of semiconductor chips of the same function are mounted on the main surface of the wiring substrate.

14. A semiconductor device according to claim 1, wherein the insulating film has a third portion formed between the plural electrodes on the wiring substrate and end portions of the wiring substrate.

15. A semiconductor device according to claim 14, wherein a bonding force between wiring lines on the wiring substrate and the seal member is small in comparison with a bonding force between the insulating film and the seal member.

16. A semiconductor device according to claim 1, wherein the thickness of the first portion of the insulating film is equal to or larger than the thickness of the second portion of the insulating film.

17. A semiconductor device according to claim 1, wherein the groove extends through the insulating film, and wiring lines on the wiring substrate are exposed to a bottom of the groove.

18. A semiconductor device according to claim 1, wherein the groove spans between the back surface of the semiconductor chip and the main surface of the wiring substrate.

19. A semiconductor device according to claim 1, wherein the semiconductor chip is quadrangular in shape and the groove is formed along each of four sides of the semiconductor chip.

20. A semiconductor device according to claim 19, wherein the first and second portions of the insulating film are connected with each other at a corner portion of the quadrangular shape.

21. A semiconductor device according to claim 1, wherein a bonding force between the adhesive and the seal member is small in comparison with a bonding force between the insulating film and the seal member.

22. A semiconductor device according to claim 1, wherein the adhesive is more hygroscopic than the seal member.

23. A semiconductor device according to claim 1, wherein the adhesive is formed on a peripheral surface of the semiconductor chip as a slope surface by a raised portion of the adhesive.

24. A method of manufacturing semiconductor devices, comprising the steps of:
   providing a wiring substrate on which a plurality of product forming areas are arrayed, the wiring substrate having wiring lines on both a main surface thereof in the product forming areas and a back surface thereof opposite to the main surface, the wiring lines on the main surface and the back surface being electrically connected with each other through conductors;
   fixing semiconductor chips respectively to the product forming areas on the main surface of the wiring substrate through a pasty adhesive;
   connecting electrodes formed on an upper surface of each of the semiconductor chips and electrodes formed on the main surface of the wiring substrate electrically with each other through conductive wires;
   clamping the wiring substrate between a lower mold and an upper mold of a molding die in a transfer molding apparatus to form a block molding package on the main surface side of the wiring substrate so as to cover each of the semiconductor chips and each of the conductive wires and so as to superimpose the wiring substrate and the block molding package on one another; and
   dividing the superimposed wiring substrate and the block molding package longitudinally and transversely at predetermined positions to form plural semiconductor devices,
   wherein in each of the product forming areas, a groove is formed between the electrodes formed en the main surface of the wiring substrate and each of semiconductor chip mounting portions for mounting the semiconductor chips, allowing a protruding portion of the pasty adhesive flowing out to the outside of each of the semiconductor chips when the semiconductor chips are fixed to the wiring substrate to stay in the groove so as not to reach the electrodes,
   wherein the adhesive is formed on a peripheral surface of the semiconductor chips as a slope surface by a raised portion of the adhesive and
   wherein the adhesive covers a part of end faces of the semiconductor chip and is not provided on the main surface of the semiconductor chip.

25. A method according to claim 24, wherein the groove is formed to have such a sectional area that the protruding portion of the pasty adhesive does not get over the groove.

26. A method according to claim 24, wherein an insulating film is formed on the main surface of the wiring substrate, surfaces of the electrodes on the wiring substrate are exposed from the insulating film, and the semiconductor chips are fixed onto the insulating film through the pasty adhesive.

27. A method according to claim 26, wherein the groove extends through the insulating film.

28. A method according to claim 26, wherein the electrodes on the main surface of the wiring substrate are arranged along a center of an opening groove formed in the insulating film.

29. A method according to claim 24, wherein the plural product forming areas are arrayed longitudinally and transversely on the wiring substrate.

* * * * *